(12) United States Patent
Ka et al.

(10) Patent No.: US 11,694,619 B2
(45) Date of Patent: Jul. 4, 2023

(54) DISPLAY APPARATUS HAVING A NOTCH

(71) Applicant: SAMSUNG DISPLAY CO., LTD., Yongin-si (KR)

(72) Inventors: Ji-Hyun Ka, Seongnam-si (KR); Taehoon Kwon, Yongin-si (KR); Kimyeong Eom, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/588,520

(22) Filed: Jan. 31, 2022

(65) Prior Publication Data
US 2022/0157241 A1 May 19, 2022

Related U.S. Application Data

(63) Continuation of application No. 17/012,798, filed on Sep. 4, 2020, now Pat. No. 11,238,794, which is a
(Continued)

(30) Foreign Application Priority Data
Mar. 27, 2018 (KR) .................. 10-2018-0035344

(51) Int. Cl.
*G09G 3/3233* (2016.01)
*G09G 3/36* (2006.01)
(Continued)

(52) U.S. Cl.
CPC ....... *G09G 3/3233* (2013.01); *G02F 1/13452* (2013.01); *G09G 3/3648* (2013.01);
(Continued)

(58) Field of Classification Search
CPC ............... G09G 3/3233; G09G 3/3648; G09G 2300/0426; G09G 2300/0842;
(Continued)

(56) References Cited

U.S. PATENT DOCUMENTS 7,253,865 B2 * 8/2007 Battersby ............ G02F 1/13336
257/E33.032
10,192,938 B2 1/2019 Yu et al.
(Continued)

FOREIGN PATENT DOCUMENTS

KR 1020130136338 12/2013
KR 1020160053047 5/2016
(Continued)

*Primary Examiner* — Bryan Earles
(74) *Attorney, Agent, or Firm* — F. Chau & Associates, LLC

(57) ABSTRACT

A display apparatus includes a substrate which includes a first pixel area and a second pixel area. A third pixel area is spaced apart from the second pixel area. A notch peripheral area is adjacent to the first, second and third pixel areas. A plurality of pixels are provided in the first, second and third pixel areas. A first scan line is disposed on the substrate. The first scan line includes a first portion disposed in the second pixel area, a second portion disposed in the third pixel area, and a third portion which connects the first portion to the second portion. The third portion is disposed in the notch peripheral area. A second scan line is disposed on the substrate in the first pixel area. A surface area of the first scan line is from about 90% to about 110% of a surface area of the second scan line.

20 Claims, 15 Drawing Sheets

Related U.S. Application Data continuation of application No. 16/260,775, filed on Jan. 29, 2019, now Pat. No. 10,769,994.

(51) Int. Cl.
*H01L 27/32* (2006.01)
*G02F 1/1345* (2006.01)
*H10K 59/123* (2023.01)
*H10K 59/131* (2023.01)
*H10K 59/121* (2023.01)

(52) U.S. Cl.
CPC ....... *H10K 59/123* (2023.02); *H10K 59/1213* (2023.02); *H10K 59/131* (2023.02)

(58) Field of Classification Search
CPC .... G09G 2310/0251; G09G 2310/0262; G02F 1/13452; G02F 2201/56; G02F 1/136286; H01L 27/3248; H01L 27/3262; H01L 27/3276; H01L 27/124; H01L 51/5203; H01L 51/56
See application file for complete search history.

(56) References Cited

U.S. PATENT DOCUMENTS

| | | | |
|---|---|---|---|
| 10,354,578 B2 | 7/2019 | Ka et al. | |
| 10,573,236 B1 | 2/2020 | Gao et al. | |
| 10,644,038 B2 * | 5/2020 | Wang | G06F 3/044 |
| 10,769,994 B2 | 9/2020 | Ka et al. | |
| 10,978,003 B2 | 4/2021 | Kim et al. | |
| 2010/0156945 A1 * | 6/2010 | Yoshida | G09G 3/3648 345/84 |
| 2012/0162179 A1 * | 6/2012 | Tanaka | G09G 3/3677 345/204 |
| 2016/0111040 A1 | 4/2016 | Kim et al. | |
| 2017/0249896 A1 | 8/2017 | Kim et al. | |
| 2018/0190190 A1 | 7/2018 | Xi et al. | |
| 2018/0196475 A1 * | 7/2018 | Bao | G06F 1/1626 |
| 2018/0204889 A1 * | 7/2018 | Yu | H01L 27/323 |
| 2019/0005915 A1 | 1/2019 | Liu et al. | |
| 2019/0073976 A1 | 3/2019 | Yeh et al. | |
| 2019/0130818 A1 | 5/2019 | Cho et al. | |
| 2019/0181213 A1 | 6/2019 | Lim | |
| 2019/0252411 A1 | 8/2019 | Lee et al. | |
| 2019/0304366 A1 | 10/2019 | Ka et al. | |
| 2020/0402460 A1 | 12/2020 | Ka et al. | |
| 2021/0066439 A1 * | 3/2021 | Kim | H01L 27/322 |

FOREIGN PATENT DOCUMENTS

| | | |
|---|---|---|
| KR | 1020160119909 | 10/2016 |
| KR | 1020170102147 | 9/2017 |
| KR | 1020170119270 | 10/2017 |

* cited by examiner

DISPLAY APPARATUS HAVING A NOTCH

CROSS-REFERENCE TO RELATED APPLICATIONS

This application is a continuation of U.S. patent application Ser. No. 17/012,798 filed on Sep. 4, 2020, which is a continuation of U.S. patent application Ser. No. 16/260,775, filed on Jan. 29, 2019, now U.S. Pat. No. 10,769,994 issued on Sep. 8, 2020, which claims priority under 35 U.S.C. § 119 to Korean Patent Application No. 10-2018-0035344, filed on Mar. 27, 2018, the disclosures of which are incorporated by reference herein in their entireties.

1. TECHNICAL FIELD

Exemplary embodiments of the present invention relate to a display apparatus, and more particularly, to a display apparatus having a notch.

2. DISCUSSION OF RELATED ART

A display apparatus may be relatively light weight and may be relatively small in size. A cathode ray tube (CRT) display apparatus may display relatively fast performance and may be acquired at relatively low prices. However, the CRT display apparatus may be relatively small and may be less portable than other display devices. Therefore, a display apparatus such as a plasma display apparatus, a liquid crystal display apparatus or an organic light emitting display apparatus may be highly regarded due to the relatively small size, relatively light weight and relatively low-power-consumption of such display apparatuses.

A display apparatus having various display areas may include a plurality of areas having different surface areas as well as a rectangular shape. However, a brightness deviation may occur for each of the areas having different surface areas, for example, as a result of structural causes, or manufacturing causes. Thus, display quality may be reduced.

SUMMARY

An exemplary embodiment of the preset invention provides a display apparatus that includes areas having different surface areas from each other, and with increased brightness uniformity.

According to an exemplary embodiment of the present invention, a display apparatus includes a substrate which includes a first pixel area and a second pixel area having a surface area smaller than that of the first pixel area. The second pixel area is connected to the first pixel area. A third pixel area is spaced apart from the second pixel area and has a surface area smaller than that of the first pixel area. The third pixel area is connected to the first pixel area. A notch is formed between the second pixel area and the third pixel area. The substrate further includes a notch peripheral area adjacent to the first, second and third pixel areas. A plurality of pixels are disposed on the substrate. The plurality of pixels are provided in each of the first, second and third pixel areas. A first scan line is disposed on the substrate. The first scan line includes a first portion disposed in the second pixel area, a second portion disposed on the third pixel area, and a third portion which connects the first portion to the second portion. The third portion is disposed in the notch peripheral area. A second scan line is disposed on the substrate in the first pixel area. A surface area of the first scan line in the second pixel area, the third pixel area, and the notch peripheral area is from about 90% to about 110% of a surface area of the second scan line in the first pixel area.

In an exemplary embodiment of the present invention, the display apparatus may include a first connecting line disposed on the substrate in the second peripheral area. The first connecting line may be electrically connected to the first scan line. A second connecting line may be disposed on the substrate in the first peripheral area. The second connecting line may be electrically connected to the second scan line. An insulation layer may be disposed between the first and second connecting lines and the first and second scan lines. Each of the first connecting line and the second connecting line may be electrically connected to each of the first and second scan lines, respectively, through a contact hole formed through the insulation layer.

In an exemplary embodiment of the present invention, the insulation layer may include an inorganic insulation material.

In an exemplary embodiment of the present invention, the display apparatus may include first and second scan drivers disposed in the first and second peripheral areas. The first and second scan drivers may be electrically connected to the first and second connecting lines respectively.

In an exemplary embodiment of the present invention, the first portion, the second portion and the third portion of the first scan line may be formed from a same layer. The third portion may include a left inclined portion, a right inclined portion, and a central portion which is disposed between the left inclined portion and the right inclined portion. The central portion may connect the left inclined portion to the right inclined portion and may be parallel with the second scan line.

In an exemplary embodiment of the present invention, the display apparatus may include a third scan driver disposed in the third peripheral area. The third scan driver may be electrically connected to second portion of the first scan line. The third portion of the first scan line may include a first central portion and a second central portion. The first central portion may be spaced apart from the second central portion by a space therebetween.

In an exemplary embodiment of the present invention, the display apparatus may include a third scan line disposed on the substrate. The third scan line may include a first portion disposed in the second pixel area, a second portion disposed in the third pixel area, and a third portion which connects the first portion to the second portion and is disposed in the notch peripheral area. An extending distance of the third portion of the first scan line may be different from that of the third portion of the third scan line.

In an exemplary embodiment of the present invention, the surface area of the first scan line and the surface area of the second scan line may be the same as each other.

In an exemplary embodiment of the present invention, the display apparatus may include a data line crossing the first and second scan lines. The first scan line may cross the data line in the notch peripheral area.

In an exemplary embodiment of the present invention, the display apparatus may include a power source supply line disposed in the first peripheral area, the second peripheral area and the notch peripheral area. The power source supply line might not overlap the first scan line.

According to an exemplary embodiment of the present invention, a display apparatus includes a substrate which includes a first pixel area and a second pixel area having a surface area smaller than that of the first pixel area. The second pixel area is connected to the first pixel area. A third pixel area is spaced apart from the second pixel area. The third pixel area has a surface area smaller than that of the first pixel area. The third pixel area is connected to the first pixel area. A notch is formed between the second pixel area and the third pixel area. The substrate further includes a notch peripheral area adjacent to the first, second and third pixel areas. A first scan line is disposed on the substrate. The first scan line includes a first portion disposed in the second pixel area, a second portion disposed in the third pixel area, and a third portion which connects the first portion to the second portion. The third portion is disposed in the notch peripheral area. A second scan line is disposed on the substrate in the first pixel area. A first connecting line is disposed on the substrate in a first peripheral area. The first connecting line is electrically connected to the first scan line. A second connecting line is disposed on the substrate in a second peripheral area. The second connecting line is electrically connected to the second scan line. An insulation layer is disposed between the first and second connecting lines and the first and second scan lines. Each of the first connecting line and the second connecting line is electrically connected to each of the first and second scan lines, respectively, through a contact hole formed through the insulation layer.

In an exemplary embodiment of the present invention, a surface area of the first scan line may be from about 90% to about 110% of a surface area of the second scan line.

In an exemplary embodiment of the present invention, the surface area of the first scan line and the surface area of the second scan line may be the same as each other.

According to an exemplary embodiment of the present invention, a display apparatus includes a first area and a second area which is adjacent to the first area. The second area has a surface area smaller than that of the first area. A third area is spaced apart from the second pixel area. A notch is formed between the second area and the third area. The display apparatus includes a first scan line including a first portion disposed in the second pixel area, a second portion disposed in the third pixel area, and a third portion which connects the first portion to the second portion. The third portion is disposed in a notch peripheral area which forms the notch. A second scan line is disposed in the first pixel area. The third portion of the first scan line includes a left inclined pardon, a right inclined portion and a central portion which is disposed between the left inclined portion and the right inclined portion. The central portion connects the left inclined portion to the right inclined portion and is parallel with the second scan line.

In an exemplary embodiment of the present invention, a surface area of the first scan line in the second pixel area, the third pixel area, and the notch peripheral area may be from about 90% to about 110% of a surface area of the second scan line in the first pixel area.

In an exemplary embodiment of the present invention, the display apparatus may include a first peripheral area disposed adjacent to the first area, and a second peripheral area adjacent to the second area. The display apparatus may include a first connecting line disposed on a substrate in a first peripheral area. The first connecting line may be electrically connected to the first scan line. A second connecting line may be disposed on the substrate in a second peripheral area. The second connecting line may be electrically connected to the second scan line. An insulation layer may be disposed between the first and second connecting lines and the first and second scan lines. Each of the first connecting line and the second connecting line may be electrically connected to each of the first and second scan lines, respectively, through a contact hole formed through the insulation layer.

In an exemplary embodiment of the present invention, the insulation layer may include an inorganic insulation material.

In an exemplary embodiment of the present invention, the display apparatus may include first and second scan drivers disposed in the first and second peripheral areas. The first and second scan drivers may be electrically connected to the first and second connecting lines, respectively.

In an exemplary embodiment of the present invention, the first portion, the second portion and the third portion of the first scan line may be formed from a same layer.

In an exemplary embodiment of the present invention, the display apparatus may include a power source supply line disposed in the first peripheral area, the second peripheral area and the notch peripheral area. The power source supply line might not overlap the first scan line.

According to an exemplary embodiment of the present invention, a display apparatus includes a first area, a second area connected with the first area and a third area connected with the first area. A notch and a notch peripheral area are positioned between the second area and the third area. The display apparatus includes a first scan line. The first scan line includes a first portion positioned in the second area. The first scan line includes a first inclined portion positioned in the notch peripheral area. The first scan line includes a first central portion positioned in the notch peripheral area and extending along a direction substantially parallel with an extending direction of the first portion of the first scan line. The first scan line includes a second portion positioned in the third area. The first scan line includes a second inclined portion positioned in the notch peripheral area. The first scan line includes a second central portion positioned in the notch peripheral area and extending along the direction substantially parallel with the extending direction of the first portion of the first scan line. The first central portion is spaced apart from the second central portion. A second scan line is positioned in the first area and extends along the direction substantially parallel with the extending direction of the first portion of the first scan line. A surface area of the first scan line in the second area, the notch peripheral area and the third area is from about 90% to about 110% of a surface area of the second scan line in the first area.

In an exemplary embodiment of the present invention, the surface area of the first scan line in the second area, the notch peripheral area and the third area may be the same as the surface area of the second scan line in the first area.

In an exemplary embodiment of the present invention, thicknesses of the first and second inclined portions of the first scan line may be greater than a thickness of the second scan line.

According to an exemplary embodiment of the present invention, a display apparatus may include a substrate including first to third pixel areas, and first to third peripheral areas to form a notch. A notch peripheral area may be formed adjacent to the first to third pixel areas in the notch. A plurality of pixels ma be disposed on the substrate. The pixels may be provided in each of the first to third pixel areas. A first scan line may be disposed on the substrate. The first scan line may include a first portion disposed in the second pixel area, a second portion disposed in the third pixel area, and a third portion which connects the first portion to the second portion and is disposed in the notch peripheral area. A second scan line may be disposed on the substrate in the first pixel area. A surface area of the first scan line may be from about 90% to about 110% of a surface area of the second scan line. For example, the surface areas of the first scan line and the second scan line may be the same to each other.

According to an exemplary embodiment of the present invention, influences to the scan lines and the thin film transistors in the first to third pixel areas may be similar to each other, such as influences due to a charge introduced during patterning or forming the contact hole of the insulation layer. Accordingly, an occurrence of a deviation of the thin film transistors between the first to third pixel areas may be reduced or eliminated. As an example, an occurrence of display quality deviations such as a luminance deviation between the first to third pixel areas may be reduced or eliminated, and thus the display quality can be increased.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Figure 1:
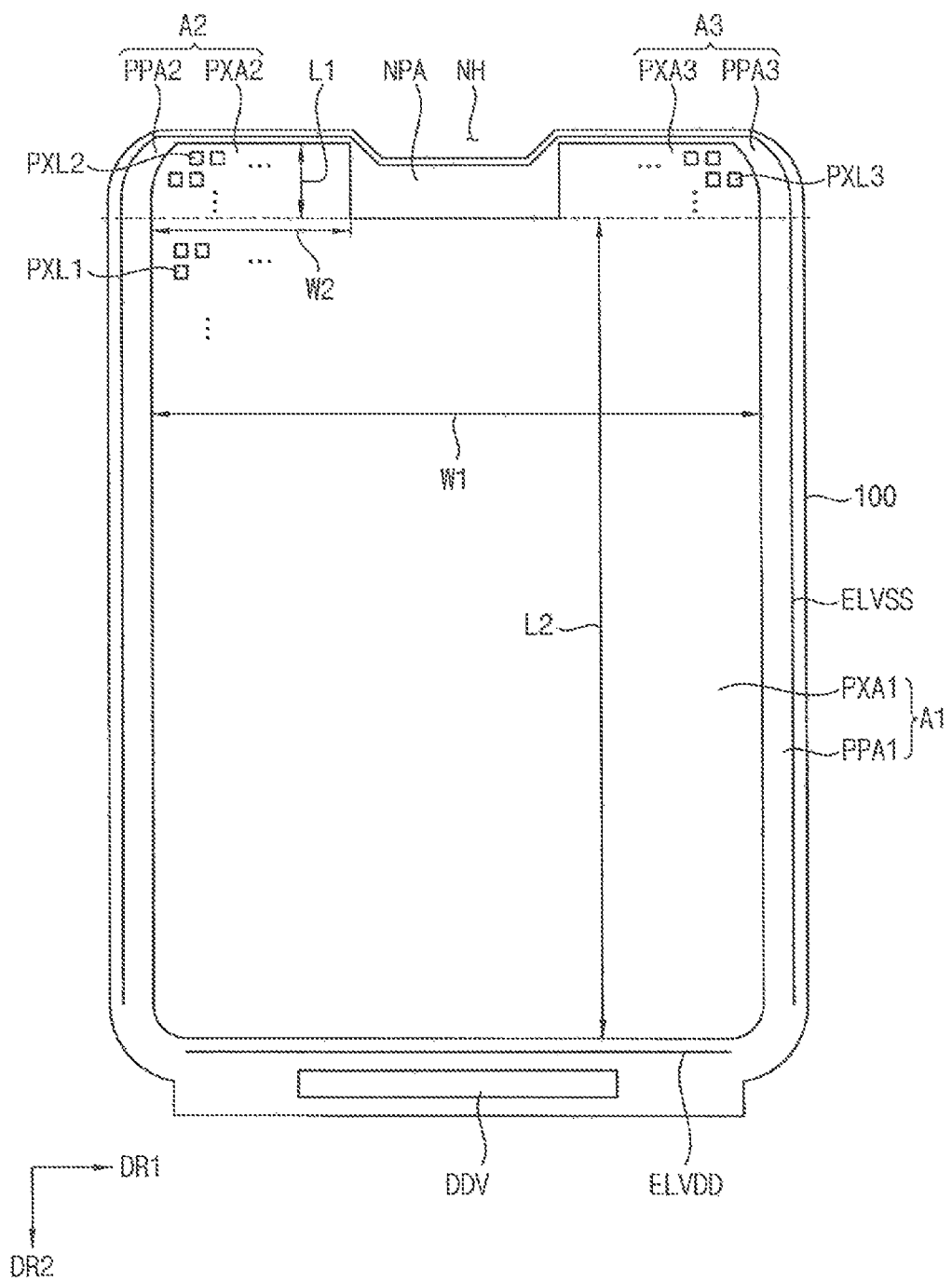
FIG. 1 is a plan view of a display apparatus according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

It will be understood that although the terms "first" and "second" may be used herein to describe various components, these components should not be limited by these terms.

Descriptions of technical features or aspects of an exemplary embodiment of the present invention should typically be considered as available and applicable to other similar features or aspects in another exemplary embodiment of the present invention. Accordingly, technical features described herein according to one exemplary embodiment of the present invention may be applicable to other exemplary embodiments of the present invention, and thus duplicate descriptions may be omitted herein.

FIG. 1 is a plan view of a display apparatus according to an exemplary embodiment of the present invention.

Referring to FIG. 1, a display apparatus may include a substrate 100, a plurality of pixels (e.g., pixels PXL1, PXL2 and PXL3), provided on the substrate 100, a driver provided on the substrate 100 and configured to drive the pixels, a power source supply part configured to supply power source to the pixels, and a wire part connecting the pixels and the driver.

The substrate 100 may include a plurality of areas, and at least two of these areas may have surface areas that are different from each other. For example, the substrate 100 may have three areas, such as, first, second and third areas A1, A2 and A3.

Each of the first to third areas A1, A2 and A3 may have various shapes. For example, each of the first to third areas A1, A2 and A3 may be provided in various shapes, e.g., a closed polygonal form that includes straight sides, a circular or an elliptical form that includes a side including a curve, a semi-circular or an elliptical form that includes a side including a straight line and a side including a curve.

For example, each of the first to third areas A1, A2 and A3 may have a generally rectangular shape, and may have a shape in which an area adjacent to at least one vertex among the vertexes of the rectangular shape is removed (e.g., to have a rounded shape).

Each of the first to third areas A1, A2 and A3 may respectively have pixel areas PXA1, PXA2 and PXA3, and peripheral areas PPA1, PPA2 and PPA3. The pixel areas PXA are areas where the pixels for displaying images are provided. Exemplary pixels will be described in more detail below. The peripheral areas PPA1, PPA2 and PPA3 might not include pixels, and thus might not display an image.

In an exemplary embodiment of the present invention, each of the first to third pixel areas PXA1, PXA2 and PXA3 may have a shape substantially corresponding to a shape of the first to third areas A1, A2 and A3, respectively.

The peripheral areas may be areas where the pixels PXL are not provided, and thus where an image is not displayed. In the peripheral areas, a driver for driving the pixels, the power source supply part for applying power source to the pixels, and a portion of a wire for connecting the pixels and the driver may be provided. The peripheral areas may be in areas corresponding to a bezel in a display apparatus, and a width of the bezel may be determined according to a width of the peripheral area.

The first to third areas A1, A2 and A3 will be described in more detail below.

The first area A1 may have the greatest surface area among the first to third areas A1, A2 and A3. The first area A1 may include the first pixel area PXA1 (e.g., where images are displayed), and the first peripheral area PPA1 adjacent to the first pixel area PXA1. For example, the first peripheral area PPA1 may surround at least a portion of the first pixel area PXA1 (e.g., in a plan view).

The first pixel area PXA may be provided in a shape corresponding to the shape of the first area A1.

The first peripheral area PPA1 may be provided at least at one side of the first pixel area PXA1. In an exemplary embodiment of the present invention, the first peripheral area PPA1 may surround a circumference of the first pixel area PXA1 (e.g., in a plan view), but may be provided in the area excluding the portion where the second area A2 and the third area A3 are arranged. Thus, an edge of the first pixel area PXA1 may be immediately adjacent to (e.g., may directly contact) an edge of the second pixel area PXA2 and/or an edge of the third pixel area PXA3. In an exemplary embodiment of the present invention, the first peripheral area PPA1 may include a breadth part extending in a width direction (e.g., in a first direction DR1), and a length part extending in a longitudinal direction (e.g., in a second direction DR2). Length parts of the first peripheral area PPA1 may be provided on opposite sides of the first pixel area PXA1 that are spaced apart from each other along the width direction of the first pixel area PXA1. As an example, the peripheral area PPA1 may be positioned at three sides of the first pixel area PXA1 in a plan view. A plan view, as described herein, may be a view along a third direction perpendicular (e.g., orthogonal) to the first and second directions DR1 and DR2. Descriptions of a first area, region or component may be similar applied to another analogous area region or component herein, and thus duplicate descriptions may be omitted. For example, descriptions of technical features described with reference to the second area A2 may be similarly applied to the third area A3.

The second area A2 may have a smaller surface area than the first area A1. The second area A2 may have the second pixel area PXA2 (e.g., where images are displayed), and the second peripheral area PPA2 that surrounds at least a portion of the second pixel area PXA2.

The second pixel area PXA2 may be provided in a shape corresponding to the shape of the second area A2. In an exemplary embodiment of the present invention, the second pixel area PXA2 may have a second width W2 that is smaller than a first width W1 of the first pixel area PXA1. The second pixel area PXA2 may have a second length L2 that is smaller than a first length L1 of the first pixel area PXA1. The second pixel area PXA2 may be provided in a form protruding from or extending from the first pixel area PXA1, and may be directly connected to the first pixel area PXA1. As an example, in the second pixel area PXA2, an edge portion that is closest to the first pixel area PXA1 may coincide with the edge of the first pixel area PXA1.

The second peripheral area PPA2 may be provided at least at one side of the second pixel area PXA2. In an exemplary embodiment of the present invention, the second peripheral area PPA2 may surround the second pixel area PXA2, but might not be provided in a portion where the first pixel area PXA1 and the second pixel area PXA2 are connected to each other. In an exemplary embodiment of the present invention, the second peripheral area PPA2 may also include a breadth part extending in the width direction, and a length part extending in the longitudinal direction. The length part of the second peripheral area PPA2 may be provided in one pair spaced apart from each other along the width direction of the second area PXA2.

The third area A3 may have a smaller surface area than the first area A1. The third area A3 may have substantially a same surface area as the second area A2. The third area A3 may have the third pixel area PXA3 (e.g., where images are displayed), and the third peripheral area PPA3 that surrounds at least a portion of the third pixel area PXA3. As an example, the phrase 'surface area' herein, may refer to a space occupied by an area or region along a plane defined by the first and second directions DR1 and DR2. Thus, surface area may be determined for an area or region by viewing the area or region in a plan view.

The third pixel area PXA3 may be provided in a shape corresponding to the shape of the third area A3.

The third pixel area PXA3 may be provided in a form protruding from or extending from the first pixel area PXA1, and may be directly connected to the first pixel area PXA1. As an example, in the third pixel area PXA3, the edge portion that is closest to the third pixel area PXA3 may coincide with the edge of the first pixel area PXA1.

The third peripheral area PPA3 may be provided at least at one side of the third pixel area PXA3. In an exemplary embodiment of the present invention, the third peripheral area PPA3 may surround the third pixel area PXA3, but might not be provided in a portion where the first pixel area PXA1 and the third pixel area PXA3 are connected to each other. In an exemplary embodiment of the present invention, the third peripheral area PPA3 may also include a breadth part extending in the width direction and a length part extending in the longitudinal direction. The length part of the third peripheral area PPA3 may also be provided in one pair spaced apart from each other along the width direction of the first pixel area PXA1.

In an exemplary embodiment of the present invention, based on an imaginary central line through the first area A1, the third area A3 may have a shape that is line symmetrical with respect to the second area A2. As such, an arrangement relationship of each configurative element provided in the third area A3 may be substantially the same as in the second area A2. However, exemplary embodiments of the present invention are not limited thereto. For example, the arrangement relationship of each configurative element provided in the third area A3 may be substantially the same as in the second area A2 except for some wires.

The substrate 100 may have a shape where the second area A2 and the third area A3 protrude or extend in the second direction DR2 from the first area A1. Since the second area A2 and the third area A3 are arranged such that they are spaced apart from each other in the first direction DR1, the substrate 100 may have a shape where the space between the second area A2 and the third area A3 is dented, e.g., a portion of the substrate 100 between the second and third areas A2 and A3 may be removed to define an indentation. For example, the substrate 100 may be provided with a notch NH between the second area A2 and the third area A3. The notch NH may be an open space between the second area A2 and the third area A3. A notch peripheral area NPA, which will be described below in more detail, may also be positioned between the second area A2 and the third area A3.

In an exemplary embodiment of the present invention, length parts (e.g., extending in the second direction DR2) of the first peripheral area PPA1 may each be connected to a portion of the length parts of the second peripheral area PPA2 or the third peripheral area PPA3. For example, a left length part of the first peripheral area PPA1 and a left length part of the second peripheral area PPA2 may be connected to each other. A right length part of the first peripheral area PPA1 and a right length part of the third peripheral area PPA3 may be connected to each other.

In an exemplary embodiment of the present invention, the second peripheral area PPA2 and the third peripheral area PPA3 may be connected through a notch peripheral area NPA. For example, the notch peripheral area NPA may be disposed between the second pixel area PXA2 and the third pixel area PXA3 to connect the second peripheral area PPA2 and the third peripheral area PPA3. For example, the notch peripheral area NPA may be provided on a side of the first pixel area PXA1 between the second area A2 and the third area A3.

The pixels may be provided in the pixel areas on the substrate 100, (e.g. in the first to third pixel areas PXA1, PXA2 and PXA3). Each pixel may be a minimum unit for displaying an image. A plurality of pixels may be provided. The pixels may include display elements that emit a color light. For example, the display element may be any one of a liquid crystal display (LCD) device, an electrophoretic display (EPD) device, an electrowetting display (EWD) device or an organic light emitting diode (OLED) device. The organic light emitting display apparatus will be described in more detail below as an example of the display element; however, exemplary embodiments of the present invention are not limited thereto.

Each pixel may emit one color among red, green or blue, but there is no limitation thereto. For example, each pixel PXL may emit a color such as cyan, magenta, yellow or white.

The pixels may include first pixels PXL1 arranged in the first pixel area PXA1, second pixels PXL2 arranged in the second pixel area PXA2, and third pixels PXL3 arranged in the third pixel area PXA3. In an exemplary embodiment of the present invention, the first to third pixels PXL1, PXL2 and PXL3 may each be provided in plural, and be arranged in a matrix form along a row extending in the first direction DR1 and along a column extending in the second direction DR2. However, there is no particular limitation to the arrangement form of the first to third pixels PXL1, PXL2, and PXL3, and thus, the first to third pixels PXL1, PXL2, and PXL3 may be arranged in various forms. For example, the first pixels PXL1 may be arranged such that the first direction DR1 is a line direction, but the second pixels PXL2 may be arranged such that a direction other than the first direction DR1, e.g., a direction that is inclined (e.g., at an oblique angle) against the first direction DR1, is the line direction. Further, the third pixels PXL3 may be arranged in a same direction to or in a different direction from the first pixels PXL1 and/or the second pixels PXL2. Alternatively, in an exemplary embodiment of the present invention the row direction may be the second direction DR2 and the column direction may be the first direction DR1.

In the second area A2 and the third area A3, the number of the second pixels PXL2 and the third pixels PXL3 may differ depending on the row. For example, in the second area A2 and the third area A3, the number of the second pixels PXL2 and the third pixels PXL3 arranged in a row corresponding to a corner including a side of a diagonal line having the inclination may be smaller than the number of the second pixels PXL2 and the third pixels PXL3 arranged in a row corresponding to a corner including a side of a straight line. Further, the number of the second pixels PXL2 and the third pixels PXL3 arranged in the row may decrease as the length of the row becomes shorter.

Further, in the second area A2 and in the third area A3, a scan line or a light emission control line of the second pixels PXL2 and the third pixels PXL3 corresponding to the same row may be electrically connected by a scan line connecting part or a light emission control line connecting part.

The driver may provide a signal to each pixel through the wire part, and control operation of the each pixel accordingly. In FIG. 1, the wire part is not illustrated for clarity of description; however, the wire part will be described in more detail below.

The driver may control scan drivers (e.g., SDV1, SDV2 and SDV3—see, e.g., FIG. 5) that provide a scan signal to each pixel along a scan line, light emission drivers (e.g., EDV1, EDV2 and EDV3—see, e.g., FIG. 5) that provide a light emission control signal to each pixel along a light emission control line, a data driver DDV that provides a data signal to each pixel along a data line, and a timing control unit. The timing control unit may control the scan driver SDV, the light emission driver EDV, and the data driver DDV.

In an exemplary embodiment of the present invention, the scan drivers SDV may include a first scan driver SDV1 connected to the first pixels PXL1, a second scan driver SDV2 connected to the second pixels PXL2, and a third scan driver SDV3 connected to the third pixels PXL3. In an exemplary embodiment of the present invention, the light emission drivers EDV may include a first light emission driver EDV1 connected to the first pixels PXL1, a second light emission driver EDV2 connected to the second pixels PXL2, and a third light emission driver EDV3 connected to the third pixel PXL3.

The first scan driver SDV1 may be arranged in the length part of the first peripheral area PPA1. Length parts of the first peripheral area PPA1 may provided as a pair spaced apart from each other along the width direction of the first pixel area PXA1, and thus, the first scan driver SDV1 may be arranged at least at one side of the length part of the first peripheral area PPA1. The first scan driver SDV1 may extend at length along the longitudinal direction of the first peripheral area PPA1.

Figure 5:
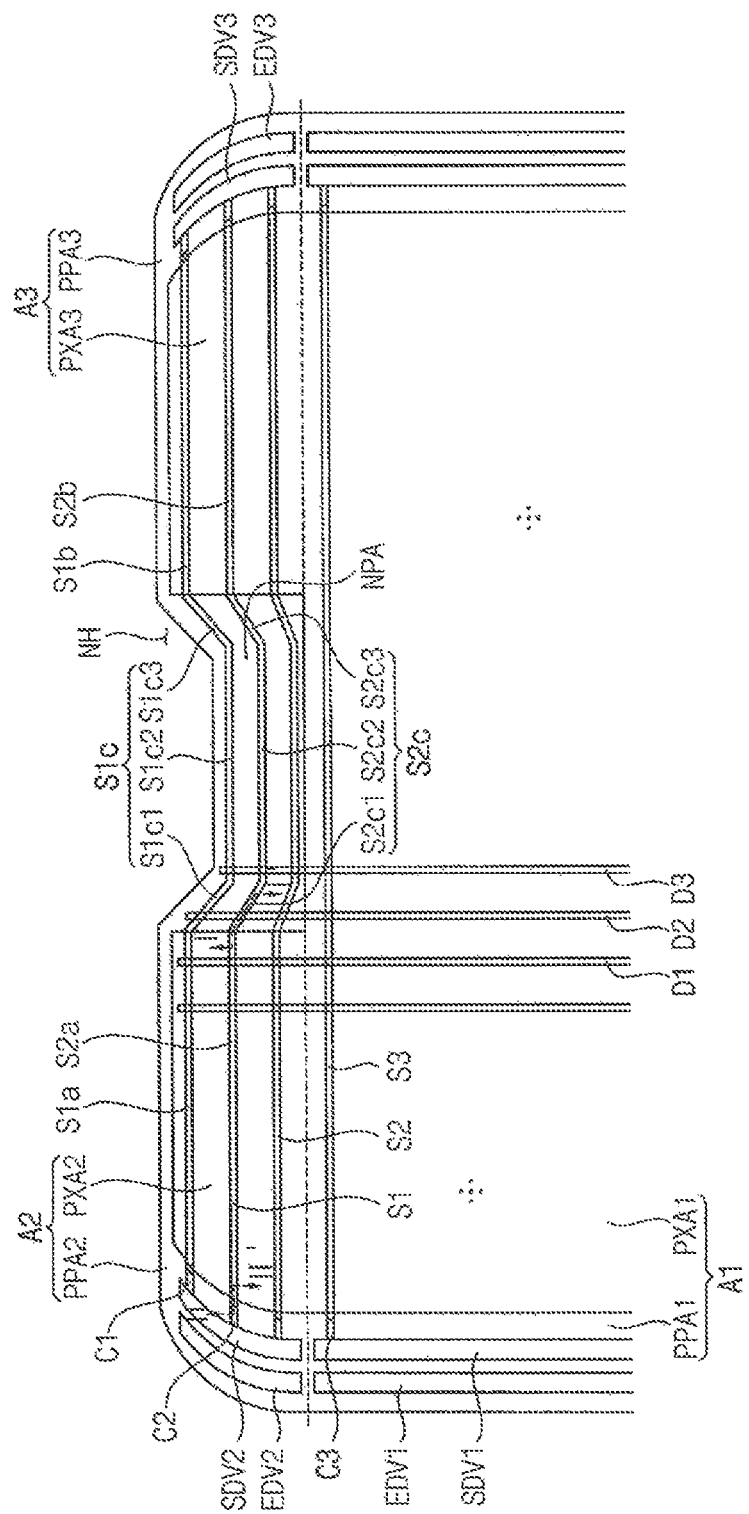
FIG. 5 is a partially enlarged view of an exemplary notch portion of the display apparatus of FIG. 1.

The second scan driver SDV2 may be arranged in the second peripheral area PPA2, and the scan driver SDV3 may be arranged in the third peripheral area PPA3 (see, e.g., FIG. 5).

In an exemplary embodiment of the present invention, the scan drivers may be directly mounted on the substrate 100. For example, the scan drivers may be in direct contact with an upper surface of the substrate 100. In the case where the scan drivers are directly mounted on the substrate 100, they may be formed together during a process where the pixels are formed. However, there is no limitation to the location or method of provision of the scan drivers. For example, the scan drivers may be formed on a separate chip and provided on the substrate 100 in a chip-on-glass form, or may be mounted onto a printed circuit board and connected to the substrate 100 by a connecting member.

The first light emission driver EDV1 may also be arranged in the length part among the first peripheral area PPA1 in a similar manner to the first scan driver SDV1. The first light emission driver EDV1 may be arranged in at least one side of the length part of the first peripheral area PPA1. The first light emission driver EDV1 may extend at length along the longitudinal direction of the first peripheral area PPA1.

In a similar manner as described above, the second light emission driver EDV2 may be arranged in the second peripheral area PPA2, and the third light emission driver EDV3 may be arranged in the third peripheral area PPA3.

In an exemplary embodiment of the present invention, the light emission drivers may be directly mounted on the substrate 100. For example, the light emission drivers may be in direct contact with an upper surface of the substrate 100. In the case where the light emission drivers are directly mounted on the substrate 100, they may be formed together during a process where the pixels PXL are formed. However, there is no limitation to the location or method of provision of the light emission drivers. For example, the light emission drivers may be formed on a separate chip and provided on the substrate 100 in a chip-on-glass form, or may be mounted onto a printed circuit board and connected to the substrate 100 by a connecting member.

In an exemplary embodiment of the present invention, the scan drivers and the light emission drivers may be adjacent to each other, and may be formed only at one side of the pairs of length parts of the peripheral areas, but there is no limitation thereto. The arrangement of the scan drivers and the light emission drivers may vary. For example, the first scan driver SDV1 may be provided at one side of the length parts of the first peripheral area PPA1, and the first light emission driver EDV1 may be provided at another side of the length part of the first peripheral area PPA1. Alternatively, the first scan driver SDV1 may be provided at both sides of the length part of the first peripheral area PPA1, and the first light emission driver EDV1 may be provided at only one side of the length part of the first peripheral area PPA1.

The data driver may be arranged in the first peripheral area PPA1. For example, the data driver DDV may be arranged in a breadth part of the first peripheral area PPA1. The data driver DDV may extend at length along the width direction of the first peripheral area PPA1.

In an exemplary embodiment of the present invention, the scan drivers, the light emission drivers, and/or the data driver DDV may exchange places with each other.

The timing control unit may be connected to the first to third scan drivers SDV1, SDV2 and SDV3, the first to third light emission drivers EDV1, EDV2 and EDV3 and the data driver DDV by wires, and there is no particular limitation to the position of arrangement of the wires. For example, the timing control unit may be mounted onto the print circuit board, and may be connected to the first to third scan drivers SDV1, SDV2 and SDV3, the first to third light emission drivers EDV1, EDV2 and EDV3, and the data driver DDV through a flexible printed circuit board, and the print circuit board may be arranged in various positions such as at one side of the substrate and on a rear surface of the substrate 100.

The power source supply part may include at least one power source supply line ELVDD or ELVSS. For example, the power source supply part may include a first power source supply line ELVDD and a second power source supply line ELVSS. The first power source supply line ELVDD and the second power source supply line ELVSS may supply power source to the first pixel PXL1, the second pixel PXL2, and the third pixel PXL3.

One of the first power source supply line ELVDD or the second power source supply link ELVSS, e.g., the first power source supply line ELVDD, may be arranged to correspond to one side of the first pixel area PXA1. For example, the first power source supply line ELVDD may be arranged in the area where the data driver DDV of the first peripheral area PPA1 is arranged. Further, the first power source supply line ELVDD may extend in the width direction of the first pixel area PXA1. In addition, the second power supply line ELVSS may be arranged not to overlap with the scan lines.

The other one of the first power source supply line ELVDD and the second power source supply line ELVSS, e.g., the second power source supply line ELVSS, may be arranged to surround the first pixel area PXA1, the second pixel area PXA2, and the third pixel area PXA3 excluding the area where the data driver DDV of the first peripheral area PPA1 is arranged. For example, the second power source supply line ELVSS may have a shape extending along the left length part of the first peripheral area PPA1, and the right length part of the second peripheral area PPA2, the third peripheral area PPA3, the notch peripheral area NPA, and the second peripheral area PPA2.

As an example above, it was described that the first power source supply line ELVDD is arranged to correspond to one side of the first pixel area PXA1 among the first peripheral area PPA1, and it was described that the second power source supply line ELVSS is arranged in the remaining peripheral areas, but there is no limitation thereto. For example, the first power source supply line ELVDD and the second power source supply line ELVSS may be arranged to surround the first pixel area PXA1, the second pixel area PXA2, and the third pixel area PXA3.

The voltage being applied to the first power source supply line ELVDD may be greater than the voltage being applied to the second power source supply line ELVSS.

Figure 2:
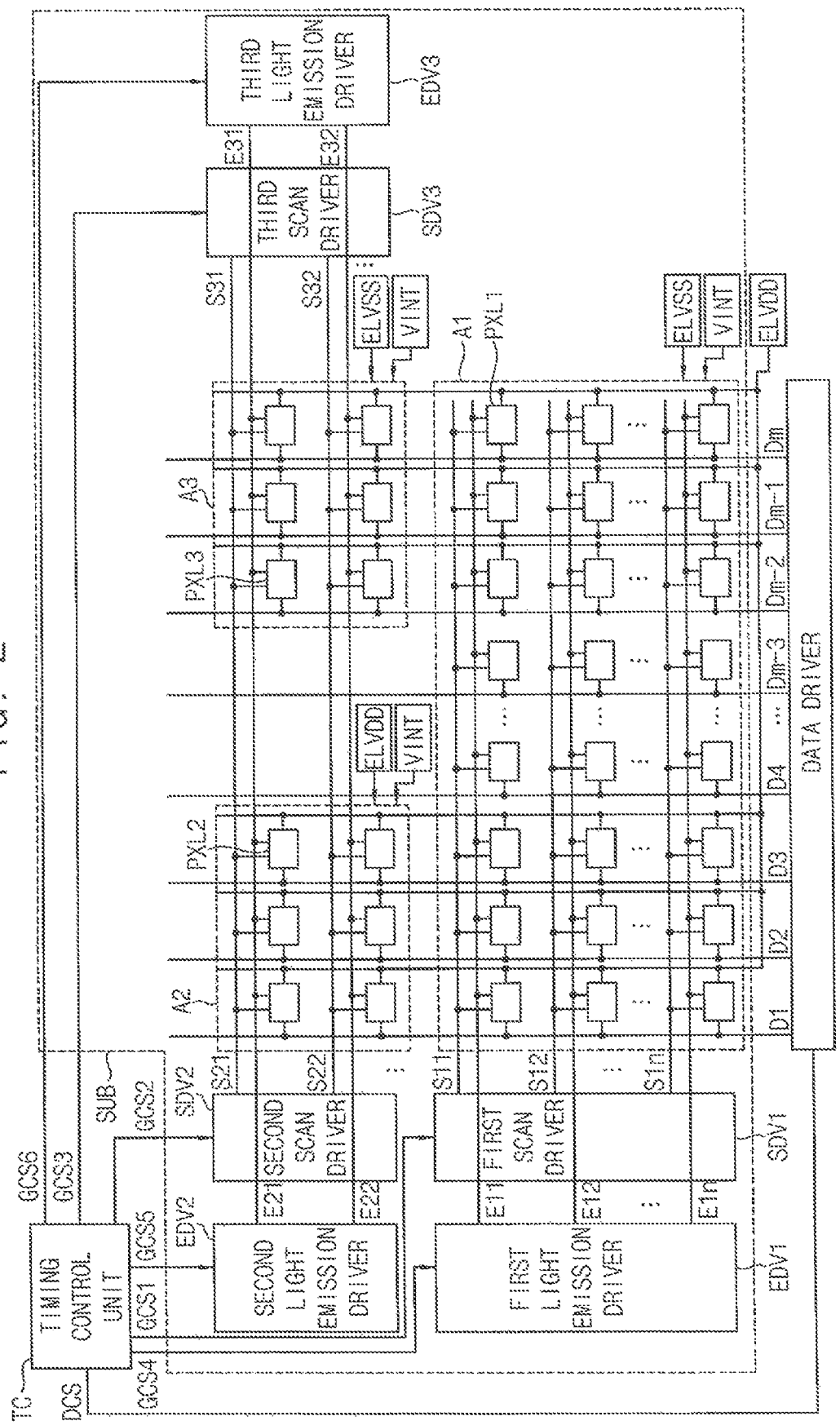
FIGS. 2 and 3 are block diagrams of pixels and a driver according to an exemplary embodiment of the present invention.
Figure 3:
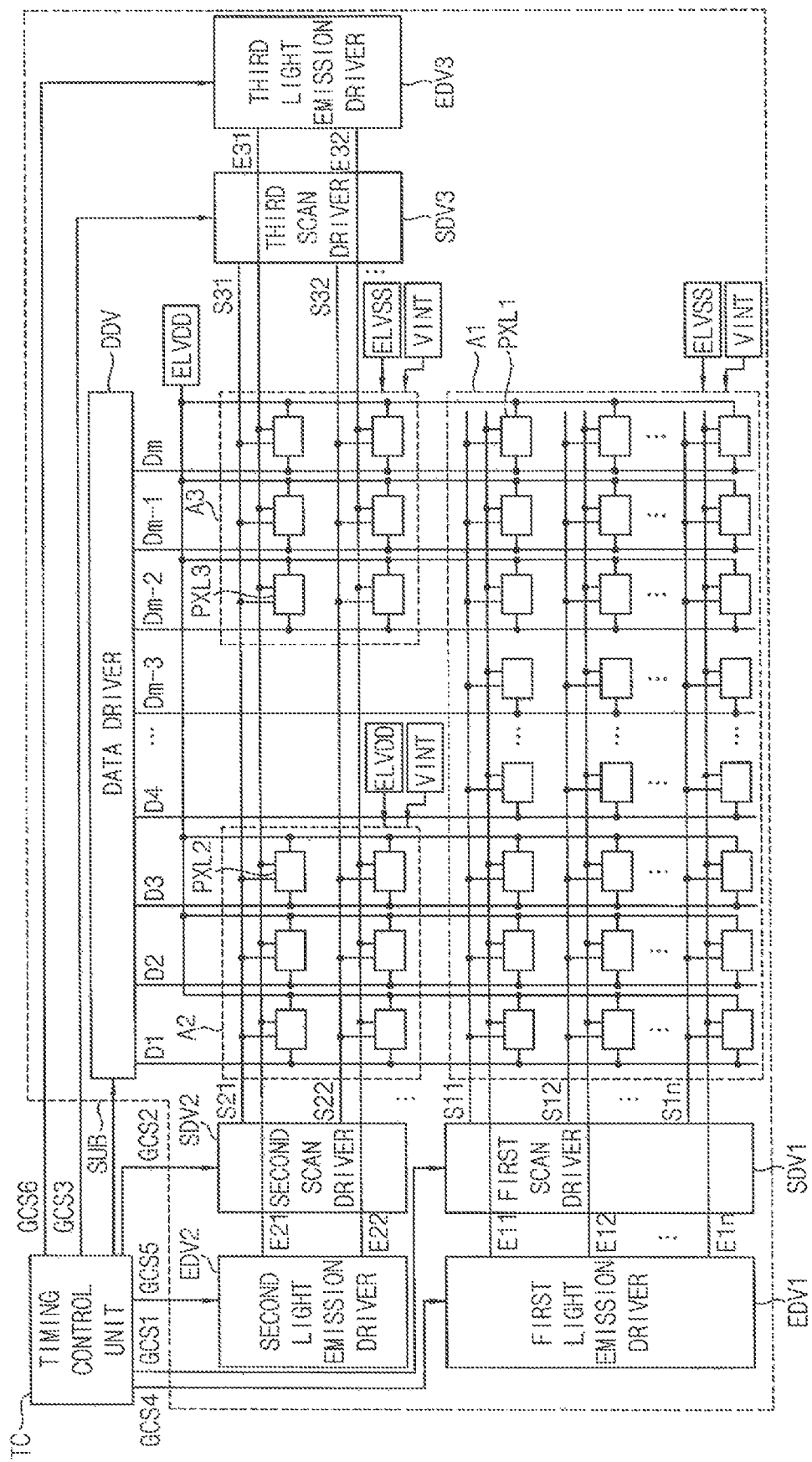

FIGS. 2 and 3 are block diagrams of pixels and a driver according to an exemplary embodiment of the present invention.

Referring to FIGS. 1 to 3, a display apparatus according to an exemplary embodiment of the present invention may include pixels (e.g., pixels PXL1, PXL2 and PXL3), a substrate SUB, a driver, and a wire part.

The pixels may include the first to third pixels PXL1, PXL2 and PXL3, and the driver may include the first to third scan drivers SDV1, SDV2 and SDV3, the first to third light emission drivers EDV1, EDV2 and EDV3, the data driver DDV, and a timing control unit TC. In FIGS. 2 and 3, the positions of the first to third scan drivers SDV1, SDV2 and SDV3, the first to third light emission drivers EDV1, EDV2 and EDV3, the data driver DDV, and the timing control unit TC are illustrated as an example and for clarity of description, and thus, when actually realizing the display device, they may be arranged in different positions inside the display device. For example, the data driver DDV may be arranged closer to the first area A1 than to the second area A2 and the third area A3, but there is no limitation thereto. For example, the data driver DDV may be arranged to be adjacent to the second area A2 and the third area A3.

The wire part provides a signal of the driver to each pixel PXL, and includes scan lines, data lines, line connecting parts, light emission control lines, a power source line and an initializing power source line.

The scan lines may include a first to third scan lines S11 to S1n, S21 and S22, S31 and S32, each of which may be connected to the first to third pixels PXL1, PXL2 and PXL3, respectively, and the light emission control lines may include a first to third light emission control lines E11 to E1n, E21 and E22, E31 and E32, each of which is connected to the first to third pixels PXL, PXL2 and PXL3, respectively. The data lines D1 to Dm and the power source line may be connected to the first to third pixels PXL1, PXL2 and PXL3.

Additionally, the second scan lines S21 and S22 and the third scan lines S31 and S32 may be electrically connected to the scan line connecting parts. For example, the second scan line S21 may be electrically connected to the third scan line S31 by the first scan line connecting part. Further, the second scan line S22 may be electrically connected to the third scan line S32 by the second scan line connecting part.

Further, the second light emission control lines E21 and E22 and the third light emission control lines E31 and E32 may be electrically connected to the light emission control line connecting parts. For example, the second light emission control line E21 may be electrically connected to the third light emission control line E31 by the first light emission control line connecting part. Further, the second light emission control line E22 may be electrically connected to the third light emission control line E32 by the second light emission control line connecting part.

The first pixels PXL1 may be disposed in the first pixel area PXA1. The first pixels PXL1 may be connected to the first scan lines S11 to S1n, the first light emission control lines E11 to E1n, and the data lines D1 to Dm. These first pixels PXL1 may be provided with a data signal from the data lines D1 to Dm when a scan signal is supplied from the first scan lines S11 to S1n. The first pixels PXL1 that received the data signal control the amount of current flowing from the first power source ELVDD to the second power source ELVSS via the organic light emitting diode.

The second pixels PXL2 may be disposed in the second pixel area PXA2. The second pixels PXL2 may be connected to the second scan lines S21, S22, the second light emission control lines E21, E22, and the data lines D1 to D3. The second pixels PXL2 may be provided with a data signal from the data lines D1 to D3 when a scan signal is supplied from the second scan lines S21, S22 and the third scan lines S31, S32. The second pixels PXL2 that received the data signal control the amount of current flowing from the first power source ELVDD to the second power source ELVSS via the organic light emitting diode.

While six second pixels PXL2 may be disposed in the second pixel area PXA2 and may be connected to two second scan lines S21, S22, two second light emission control lines, and three data lines D1 to D3, there is no limitation thereto. For example, a plurality of second pixels PXL2 may be arranged to correspond to the size of the second pixel area PXA2, and the number of the second scan lines, the second light emission control lines, and data lines may be set variously to correspond to the second pixels PXL2.

The third pixels PXL3 may be disposed in the third pixel area PXA3 divided by the third scan lines S31, S32, the third light emission control lines E31, E32, and the data lines Dm-2 to Dm. Such third pixels PXL3 may be provided with a data signal from the data lines Dm-2 to Dm when a scan signal is supplied from the third scan lines S31, S32 and the second scan lines S21, S22. The third pixels PXL3 that received the data signal control the amount of current flowing from the first power source ELVDD to the second power source ELVSS via the organic light emitting diode.

In addition, although six third pixels PXL3 may be disposed in the third pixel area PXA3 and may be connected to two third scan lines S31, S32, two third light emission control lines E31, E32 and three data lines Dm-2 to Dm, there is no limitation thereto. For example, the plurality of third pixels PXL3 may be arranged to correspond to the size of the third pixel area PXA3, and the number of the third scan lines, the third light emission control lines, and the data lines may be set variously to correspond to the third pixels PXL3.

The first scan driver SDV1 may supply a scan signal to the first scan lines S1 to S1n in response to a first gate control signal GCS1 from the timing control unit TC. For example, the first scan driver SDV1 may supply the scan signal to the first scan lines S11 to S1n sequentially. When the scan signal is sequentially supplied to the first scan lines S11 to S1n, the first pixels PXL1 may be sequentially selected in horizontal line units.

The second scan driver SDV2 may supply a scan signal to the second scan lines S21, S22 in response to a second gate control signal GCS2 from the timing control unit TC. Here, the scan signal supplied to the second scan lines S21, S22 may be supplied to the third scan lines S31, S32 via the scan line connecting parts. The second scan driver SDV2 may supply the scan signal to the second scan lines S21, S22 sequentially. When the scan signal is supplied to the second scan lines S21, S22, sequentially, the second pixels PXL2 and the third pixels PXL3 may be selected sequentially in horizontal line units.

The third scan driver SDV3 may supply a scan signal to the third scan lines S31, S32 in response to the third gate control signal GCS3 from the timing control unit TC. The scan signal supplied to the third scan lines S31, S32 may be supplied to the second scan lines S21, S22 via the scan line connecting part. The third scan driver SDV3 may supply the scan signal sequentially to the third scan lines S31, S32. When the scan signal is supplied to the third scan lines S31, S32 sequentially, the second pixels PXL2 and the third pixels PXL3 may be selected sequentially in horizontal line units.

Since the second scan lines S21, S22 and the third scan lines S31, S32 may be electrically accessed by the scan line connecting parts, the scan signal being supplied from the second scan driver SDV2 and the scan signal being supplied from the third scan driver SDV3 may be supplied such that they are synchronized to each other.

For example, the scan signal being supplied from the second scan driver SDV2 to the second scan line S21 may be supplied at the same time as the scan signal being supplied from the scan driver SDV1 to the third scan line S31. Likewise, the scan signal being supplied from the second scan driver SDV2 to the second scan line S22 may be supplied at the same time as the scan signal being supplied from the third scan driver SDV3 to the third scan line S32.

When a scan signal is supplied to the second scan lines S21, S22 and the third scan lines S31, S32 using the second scan driver SDV2 and the third scan driver SDV3, a delay of scan signal by an RC delay of the second scan lines S21, S22 and the third scan lines S31, S32 may be prevented, and accordingly, it is possible to supply a wanted scan signal to the second scan lines S21, S22 and the third scan lines S31, S32.

In addition, the second scan driver SDV2 and the third scan driver SDV3 may be driven such that they are synchronized to each other, and accordingly, the second scan driver SDV2 and the third scan driver SDV3 may be driven by the same gate control signal. For example, the third gate control signal GCS3 being supplied to the third scan driver SDV3 may be set as the same signal as the second gate control signal GCS2.

In an exemplary embodiment of the present invention, the third scan driver SDV3 may be omitted, and the second scan driver SDV2 may be connected to the second region A2 and the third region A3 to drive the pixels in the second and third regions A2 and A3.

The first light emission driver EDV1 may supply a light emission control signal to the first light emission control lines E11 to E1n in response to the fourth gate control signal GCS4 from the timing control unit TC. For example, the first light emission driver EDV1 may supply the light emission control signal to the first light emission control lines E11 to E1n sequentially.

Here, the light emission control signal may be set to have a greater width than the scan signal. For example, the light emission control signal being supplied to the i-th (i being a natural number) first light emission control line E1i may be supplied such that it is overlapped with the scan signal being supplied to the i-1th first scan line S1*i*-1 and the scan signal being supplied to the i-th first scan line S1*i* for at least a partial period of time.

The second light emission driver EDV2 may supply a light emission control signal to the second light emission control lines E21, E22 in response to the fifth gate control signal GCS5 from the timing control unit TC. Here, the light emission control signal supplied to the second light emission control lines E21, E22 may be supplied to the third light emission control lines E31, E32 via the light emission control line connecting parts. The second light emission control driver EDV2 may supply the light emission control signal to the second light emission control lines E21, E22 sequentially.

The third light emission driver EDV3 may supply the light emission control signal to the third light emission control lines E31, E32 in response to the sixth gate control signal GCS6 from the timing control unit TC. Here, the light emission control signal supplied to the third light emission control lines E31, E32 may be supplied to the second light emission control lines E21, E22 via the light emission control line connecting parts. The third light emission driver EDV3 may supply the light emission control signal to the third light emission control lines E31, E32 sequentially.

In addition, the light emission control signal may be set to a gate off voltage (for example, high voltage) such that a transistor included in the pixels PXL may be turned-off, and the scan signal may be set to a gate on voltage (for example, low voltage) such that the transistor included in the pixels PXL may be turned-on.

Since the second light emission control lines E21, E22 and the third light emission control lines E31, E32 are electrically connected by the light emission control line connecting parts, the light emission control signal being supplied from the second light emission driver EDV2 and the light emission control signal being supplied from the third light emission driver EDV3 may be supplied such that they are synchronized to each other.

For example, the light emission control signal being supplied from the second light emission driver EDV2 to the second light emission control line E21 may be supplied at substantially the same time as the light emission control signal being supplied from the third light emission control driver EDV3 to the third light emission control line E31. Likewise, the light emission control signal being supplied from the second light emission driver EDV2 to the second light emission control line E22 may be supplied at substantially the same time as the light emission control signal being supplied from the third light emission driver EDV3 to the third light emission control line E32.

When the light emission control signal is supplied to the second light emission control lines E21, E22 and the third light emission control lines E31, E32 using the second light emission driver EDV2 and the third light emission driver EDV3, a delay of light emission control signal by an RC delay of the second light emission control lines E21, E22 and the third light emission control lines E31, E32 may be prevented, and accordingly, it is possible to supply the wanted scan signal to the second light emission control lines E21, E22 and the third light emission control lines E31, E32.

In addition, the second light emission driver EDV2 and the third light emission driver EDV3 may be driven such that they are synchronized to each other, and accordingly, the second light emission driver EDV2 and the third light emission driver EDV3 may be driven by the same gate control signal GCS. For example, the sixth gate control signal GCS6 being supplied to the third light emission driver EDV3 may be set as substantially the same signal as the filth gate control signal GCS5.

The data driver DDV may supply a data signal to the data lines D1 to Dm in response to a data control signal DCS. The data signal supplied to the data lines D1 to Dm may be supplied to the pixels PXL selected by the scan signal.

The timing control unit TC may supply the gate control signals GCS1 to GCS6 generated based on the timing signals being supplied from outside to the scan drivers SDV and the light emission drivers EDV, and the data control signal DCS to the data driver DDV.

Each of the gate control signals GCS1 to GCS6 includes a start pulse and clock signals. The start pulse controls the timing of the first scan signal or the first light emission control signal. The clock signals are used to shift the start pulse.

The data control signal DCS includes a source start pulse and clock signals. The source start pulse controls the starting time point of the sampling of the data. The clock signals are used to control the sampling operation.

Meanwhile, when the display device is being driven sequentially, the first scan driver SDV1 may be provided with a last output signal of the second scan driver SDV2 as the start pulse. Likewise, when the display device is being driven sequentially, the first light emission driver EDV1 may be provided with the last output signal of the second light emission driver LDV2 as the start pulse.

Figure 4:
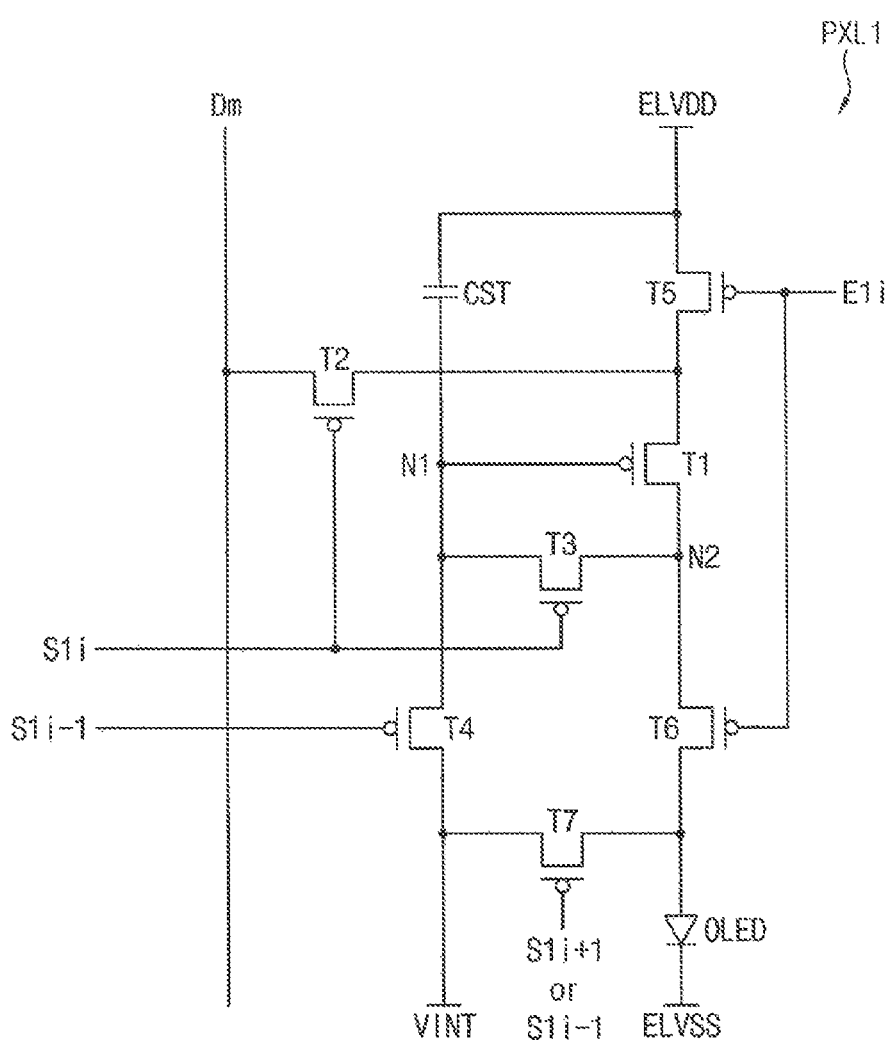
FIG. 4 illustrates an exemplary first pixel of FIG. 2.

FIG. 4 illustrates an exemplary first pixel of FIG. 2.

In FIG. 4, as an example and for clarity of description, a pixel accessed to an m-th data line Dm and i-th first scan line S1*i* are illustrated.

Referring to FIG. 4, the first pixel PXL1 according to an exemplary embodiment of the present invention may be provided with an organic light emitting diode OLED, a first transistor T1 to seventh transistor T7, and a storage capacitor Cst.

An anode of the organic light emitting diode OLED may be connected to the first transistor T1 via the sixth transistor T6, and a cathode of the organic light emitting diode OLED may be connected to the second power source ELVSS. The organic light emitting diode OLED may generate light of a certain brightness that corresponds to the amount of current being supplied from the first transistor T1.

The first power source ELVDD may be set to a higher voltage than the second power source ELVSS such that current may flow to the organic light emitting diode OLED.

The seventh transistor T7 may be positioned between an initializing power source Vint and the anode of the organic light emitting diode OLED. Further, the gate electrode of the seventh transistor T7 may be connected to the i-th first scan line S1*i*. The seventh transistor T7 is turned-on when the scan signal is being supplied to the i-th first scan line S1*i*, and may provide the voltage of the initializing power source Vint to the anode of the organic light emitting diode OLED. Here, the initializing power source Vint may be set to a lower voltage than the data signal.

The sixth transistor T6 may be positioned between the first transistor T1 and the organic light emitting diode OLED. Further, the gate electrode of the sixth transistor T6 may be connected to the i-th first light emission control line E1*i*. The sixth transistor T6 may be turned-off when tine light emission control signal is supplied to the i-th first light emission control line E1*i*, and in other cases, the sixth transistor T6 may be turned-on.

The fifth transistor T5 may be positioned between the first power source ELVDD and the first transistor T1. Further, a gate electrode of the fifth transistor T5 may be connected to the i-th first light emission control line E1i. The fifth transistor 15 may be turned-off when the light emission control signal is being supplied to the i-th first light emission control line E1i, and in other cases the fifth transistor T5 may be turned-on.

A first electrode of the first transistor T1 (driving transistor) may be connected to the first power source ELVDD via the fifth transistor T5, and a second electrode of the first transistor T1 may be connected to the anode of the organic light emitting diode OLED via the sixth transistor. Further, a gate electrode of the first transistor T1 may be connected to a first node N1. The first transistor may control the amount of current flowing from the first power source ELVDD to the second power source ELVSS via the organic light emitting diode OLED in response to the voltage of the first node N1.

The third transistor T3 may be positioned between the second electrode of the first transistor T1 and the first node N1. A gate electrode of the third transistor T3 may be connected to the i-th first scan line S1i. The third transistor T3 may be turned-on when a scan signal is being supplied to the i-th first scan line S1i, and may be electrically connected to the second electrode of the first transistor T1 and the first node N1. Therefore, when the third transistor T3 is turned-on, the first transistor T1 may be accessed in a diode form.

The fourth transistor 14 may be positioned between the first node N1 and the initializing power source Vint. Further, a gate electrode of the fourth transistor T4 may be connected to an i-1th first scan line S1i-1. The fourth transistor T4 may be turned-on when a scan signal is being supplied to the i-1th first scan line S1i-1, and supplies the voltage of the initializing voltage Vint to the first node N1.

The second transistor T2 may be positioned between the m-th data line Dm and the first electrode of the first transistor T1. Further, a gate electrode of the second transistor T2 may be connected to the i-th first scan line S1i. The second transistor 12 may be turned-on when a scan signal is being supplied to the i-th first scan line S1i, and electrically accesses the m-th data line Dm and the first electrode of the first transistor T1.

The storage capacitor Cst may be positioned between the first power source ELVDD and the first node N1. The storage capacitor Cst may store a data signal and a voltage corresponding to a threshold voltage of the first transistor.

The second pixel PXL2 and the third pixel PXL3 may be substantially the same as the first pixel PXL1. Thus, duplicative descriptions of the second pixel PXL2 and the third pixel PXL3 may be omitted herein.

Figure 6:
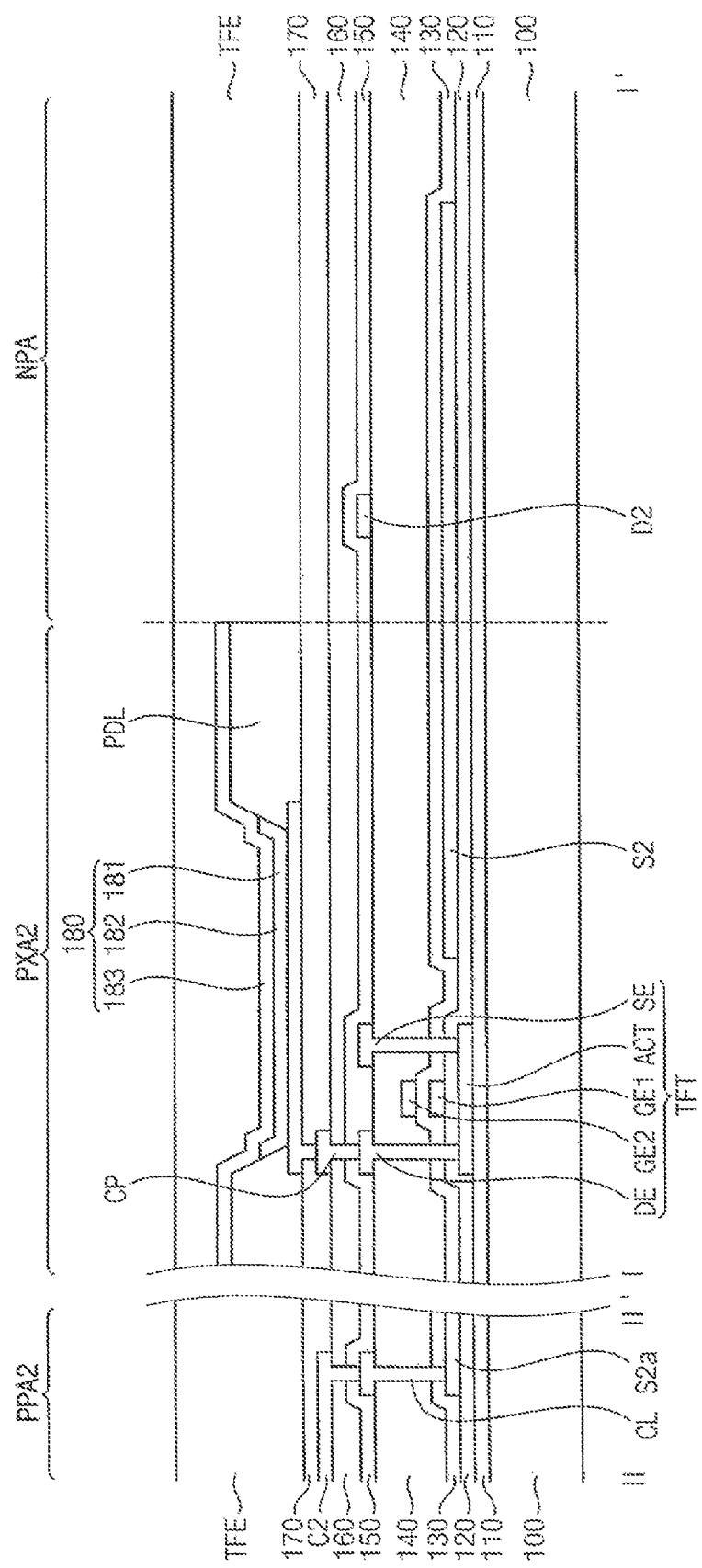
FIG. 6 is a cross-sectional view taken along lines I-I' and II-II' of FIG. 5.

FIG. 5 is a partially enlarged view of an exemplary notch portion of the display apparatus of FIG. 1. FIG. 6 is a cross-sectional view taken along lines I-I'and II-II' of FIG. 5.

Referring to FIGS. 5 and 6, the display apparatus may include the substrate 100, a buffer layer 110, an active pattern ACT, a first insulation layer 120, a first gate pattern, a second insulation layer 130, a second gate pattern, a third insulation layer 140, a first data pattern, a fourth insulation layer 150, a fifth insulation layer 160, a second data pattern, a sixth insulation layer 170, a pixel defining layer PDL, a light emitting structure 180 and a thin film encapsulation layer TFE.

The substrate 100 including a transparent or opaque insulation materials may be provided. For example, the substrate 100 may include a quartz substrate, a synthetic quartz substrate, a calcium fluoride substrate, a fluoride-doped quartz substrate, a sodalime glass substrate, or a non-alkali glass substrate. Alternatively, the substrate 100 may include a flexible transparent material such as a flexible transparent resin substrate (e.g., a polyimide substrate).

The buffer layer 110 may be disposed on the substrate 100. The buffer layer 110 may be disposed on the entire substrate 100. For example, the buffer layer 110 may cover substantially an entire upper surface of the substrate 100. The buffer layer 110 may prevent the diffusion of metal atoms and/or impurities from the substrate 100 into the active pattern ACT. In addition, the buffer layer 110 may control a rate of a heat transfer in a crystallization process for forming the active pattern ACT, and thus a substantially uniform active pattern ACT may be formed.

The active pattern ACT may be disposed on the buffer layer 110. The active pattern ACT may include amorphous silicon or polycrystalline silicon. In an exemplary embodiment of the present invention, the active pattern ACT may include oxide of at least one substance selected from indium (In), gallium (Ga), stannum (Sn), zirconium (Zr), vanadium (V), hafnium (Hf), cadmium (Cd), germanium (Ge), chromium (Cr), titanium (Ti), or zinc (Zn). The active pattern ACT may include a channel region and a source region and a drain region doped with an impurity.

The first insulation layer 120 may be disposed on the buffer layer 110. The first insulation layer 120 may be uniformly formed on the buffer layer 110 along a profile of the active pattern ACT. The first insulation layer 120 may include a silicon compound, or metal oxide.

The first gate pattern including a plurality of scan lines and a first gate electrode GE1 may be disposed on the first insulation layer 120. The scan lines may include the first scan line S1, the second scan line S2, of the third scan line S3. The first gate electrode GE1 may overlap the active pattern ACT (e.g., along a direction orthogonal to an upper surface of the substrate 100). The first gate pattern may be formed using a metal, an alloy, a metal nitride, a conductive metal oxide, or a transparent conductive material.

The first scan line S1 may extend in the first direction DR1. The first scan line S1 may include the first portion S1a, the second portion S1b and the third portion S1c. The first portion S1a may be disposed in the first pixel area PXA1. The second portion S1b may be disposed in the second pixel area PXA2. The third portion S1c may be disposed between the first portion S1a and the second portion S1b, connect the first portion S1a to the second portion S1b, and may be disposed in the notch peripheral area NPA.

The third portion S1c may include the left inclined portion S1c1, the central portion S1c2 and the right inclined portion S1c3. As an example, since the notch NH may have U-shape, the third portion S1c may include the left inclined portion S1c1 which is inclined in a right downward direction from the first portion S1a, the right inclined portion S1c3 which is inclined in a left downward direction from the second portion S1b, and the central portion S1c2 which is disposed between the left inclined portion S1c1 and the right inclined portion S1c3, connects the left inclined portion S1c1 to the right inclined portion S1c3 and is substantially parallel with the first direction DR1.

The second scan line S2 may extend in the first direction DR1. The second scan line S2 may include the first portion S2a, the second portion S2b and the third portion S2c. The first portion S2a may be disposed in the first pixel area PXA1. The second portion S2b may be disposed in the second pixel area PXA2. The third portion S2c may be disposed between the first portion S2a and the second portion S2b, connect the first portion S2a to the second portion S2b, and may be disposed in the notch peripheral area NPA.

The third portion S2c may include the left inclined portion S2c1, the central portion S2c2 and the right inclined portion S2c3. As an example, since the notch NH may have U-shape, the third portion S2c may include the left inclined portion S2c1 which is inclined in a right downward direction from the first portion S2a, the right inclined portion S2c3 which is inclined in a left downward direction from the second portion S2b, and the central portion S2c2 which is disposed between the left inclined portion S2c1 and the right inclined portion S2c3, connects the left inclined portion S2c1 to the right inclined portion S2c3 and is in parallel with the first direction DR1. Here, degree of tilting of the left inclined portion S2c1 and the right inclined portion S2c3 of the second scan line S2 may be different from degree of tilting of the left side inclined portion S1c1 and the right inclined portion S1c3 of the first scan line S1.

The third scan line S3 may extend in the first direction DR1. The third scan line S3 may be disposed in the first pixel area PXA1. Thus, the third scan line S3 might not overlap the second area A2, the third area A3 or the notch peripheral area NPA.

It is preferable that the first scan line S1, the second scan line S2 and the third scan line S3 have substantially the same surface area as each other. Herein, the surface area of the first scan line S1 may refer to surface areas in the second pixel area PXA2, the notch surrounding area NPA, and the third pixel area PXA3. The surface area of the second scan line S2 may refer to surface areas in the second pixel area PXA2, the notch peripheral area NPA, and the third pixel area PXA3. The surface area of the third scan line S3 may refer to a surface area in the first pixel area PXA1. For example, the surface area of the first scan line S1 or the second scan line S2 may be from about 90% to about 110% of the surface area of the third scan line S3.

As an example, the first scan line S1 and the second scan line S2 may be any one of S21 and S22 of FIG. 2, and the third scan line S3 may be any of S11 to S1n of FIG. 2.

The second insulation layer 130 may be disposed on the first insulation layer 120 on which the first gate pattern is disposed. For example, the second insulation layer 130 may be substantially uniformly formed on the first insulation layer 120 along a profile of the first gate pattern. Here, the second insulation layer 130 may have a relatively small thickness, such that a stepped portion may be formed at a portion of the second insulation layer 130 adjacent to the first gate layer. In an exemplary embodiment of the present invention, the second insulation layer 130 may have a relatively large thickness for sufficiently covering the active pattern, so that the second insulation layer 130 may have a substantially level surface. The second insulation layer 130 may include a silicon compound, or a metal oxide. The second insulation layer 130 may include a plurality of layers.

The second gate pattern including a second gate electrode GE2 may be disposed on the second insulation layer 130. The second gate electrode GE2 may form a storage capacitor with the gate electrode GE. The second gate pattern may be formed using a metal, an alloy, a metal nitride, a conductive metal oxide, or a transparent conductive material.

The third insulation layer 140 may be disposed on the second insulation layer 130 on which the second gate pattern is disposed. For example, the third insulation layer 140 may sufficiently cover the second gate pattern on the second insulation layer 130, and may have a substantially planar top surface without creating a step portion adjacent to the second gate pattern. In an exemplary embodiment of the present invention, the third insulation layer 140 may cover the second gate pattern on the second insulation layer 130 and may have a substantially uniform thickness along a profile of the second gate pattern. The third insulation layer 140 may include a silicon compound, or a metal oxide. The third insulation layer 140 may include a plurality of layers.

The first data pattern may be disposed on the third insulation layer 140. The first data pattern may be formed using a metal, an alloy, a metal nitride, a conductive metal oxide, or a transparent conductive material. The first data pattern may include a drain electrode DE, a source electrode SE, a plurality of data lines, and a connection electrode CL. The plurality of data lines may include a first data line D1, a second data line D2, and a third data line D3.

The source electrode SE may be electrically connected to the source region of the active pattern ACT through a contact hole formed through the first to third insulation layers 120, 130 and 140. The drain electrode DE may be electrically connected to the drain region of the active pattern ACT through a contact hole formed through the first to third insulation layers 120, 130 and 140.

The active pattern ACT, the first gate electrode GE1, the source electrode SE, and the drain electrode DE may be included in a thin film transistor TFT. For example, the thin film transistor TFT may be any one of the transistors described in more detail above with reference to FIG. 4.

Each of the first to third data lines D1, D2 and D3 may extend in a second direction DR2. The first to third data lines D1, D2 and D3 may cross the first to third scan lines S1, S2 and S3. For example, the second and third data lines D2 and D3 may overlap the third portions S1c and S2c of the first and second scan lines S1 and S2 in the notch peripheral area NPA (e.g., along a direction orthogonal to an upper surface of the substrate 100).

Here, the first data line D1 may be any one of D1 D2, D3 or D4 of FIG. 2, and the second data line D2 and the third data line D3 may be any one of D4 to Dm-3 of FIG. 2.

The connecting electrode CL may electrically connect the scan line formed with the first gate pattern to a connection line (e.g., connection line C2), which will be described in more detail below, in the first to third peripheral areas PPA1, PPA2, and PPA3.

The fourth insulation layer 150 may be disposed on the third insulation layer 140 on which the first data pattern is disposed. The fourth insulation layer 150 may be formed using an inorganic material such as a silicon compound, a metal, or a metal oxide.

The fifth insulation layer 160 may be disposed on the fourth insulation layer 150. The fifth insulation layer 160 may have a single-layered structure or a multi-layered structure including at least two insulation films. The fifth insulation layer 160 may be formed using an organic material. For example, the fifth insulation layer 160 may include a photoresist, an acryl-based resin, a polyimide-based resin, a polyamide-based resin, or a siloxane-based resin. These may be used alone or in a combination thereof.

The second data pattern including a contact pad CP and the connecting line may be disposed on the fifth insulation layer 160.

The contact pad CP may be electrically connected to the drain electrode DE through a contact hole formed through the fourth and fifth insulation layers 150 and 160. The second SD layer may be formed using a metal, an alloy, a metal nitride, a conductive metal oxide, or a transparent conductive material. Although the contact pad CP may be directly connected to the drain electrode DE, the contact pad CP may also be connected to the drain electrode DE through a circuit such as a thin film transistor depending on the pixel structure.

The connecting line may be electrically connected to the scan line through the connecting electrode CL. The connecting line may connect each of the scan lines to the scan drivers.

As an example, the connection line may include a first connecting line C1, a second connecting line C2, and a third connecting line C3. According to an exemplary embodiment of the present invention, an insulation layer (e.g., at least one of insulation layers 120, 130, 140, 150, 160 or 170) may be positioned between the first connecting line C1 and the second connecting line C2, and between the first scan line S1 and the second scan line S2 (e.g., in a plan view). The insulation layer may also be positioned between the second connecting line C2 and the third connecting line C3, and between the second scan line S2 and the third scan line S3 (e.g., in a plan view).

The first connecting line C1 may be connected to the connecting electrode CL through a contact hole formed through the fourth and fifth insulation layers 150 and 160 in the second peripheral area PPA2, and may be electrically connected to the first portion S1a of the scan line S1. The first connecting line C1 may be electrically connected to a second scan driver SD2 is the second peripheral area PPA2. The second connecting line C2 may be connected to the connecting electrode CL through a contact hole formed through the fourth and fifth insulation layers 150 and 160 in the second peripheral area PPA2, and may be electrically connected to the first portion S2a of the scan line S2. The second connecting line C2 may be electrically connected to the second scan driver SDV2 in the second peripheral area PPA2. The third connecting line C3 may be connected to the connecting electrode CL through a contact hole formed through the fourth and fifth insulation layers 150 and 160 in the first peripheral area PPA1, and may be electrically connected to the third scan line S3. The third connecting line C3 may be electrically connected to the first scan driver SDV1 in the first peripheral area PPA1

The sixth insulation layer 170 may be disposed on the fifth insulation layer 160 on which the second data pattern is disposed. The sixth insulation layer 170 may have a single-layered structure or a multi-layered structure including at least two insulation films. The sixth insulation layer 170 may be formed using an organic material. For example, the sixth insulation layer 170 may include a photoresist, an acryl-based resin, a polyimide-based resin, a polyamide-based resin, or a siloxane-based resin. In an exemplary embodiment of the present invention, the sixth insulation layer 170 may be formed using an inorganic material such as a silicon compound, a metal, or a metal oxide.

The light emitting structure 180 may include a first electrode 181, a light emitting layer 182 and a second electrode 183.

The first electrode 181 may be disposed on the sixth insulation layer 170. The first electrode 181 may be electrically connected to the contact pad CP through a contact hole formed through the sixth insulation layer 170.

The first electrode 181 may include a reflective material or a transmissive material in accordance with the emission type of the display apparatus. For example, the first electrode 181 may be formed using aluminum, an alloy including aluminum, aluminum nitride, silver, alloy including silver, tungsten, tungsten nitride, copper, an alloy including copper, nickel, an alloy including nickel, chrome, chrome nitride, molybdenum, an alloy including molybdenum, titanium, titanium nitride, platinum, tantalum, tantalum nitride, neodymium, scandium, strontium ruthenium oxide, zinc oxide, indium tin oxide, tin oxide, indium oxide, gallium oxide, or indium zinc oxide. These may be used alone or in a combination thereof. In an exemplary embodiment of the present invention, the first electrode 181 may have a single layer structure or a multi layer structure, which may include a metal film, an alloy film, a metal nitride film, a conductive metal oxide film and/or a transparent conductive film.

The pixel defining layer PDL may be disposed on the sixth insulation layer 170 on which the first electrode 181 is disposed. The pixel defining layer PDL may be formed using an organic material. For example, the pixel defining layer PDL may include a photoresist, an acyl-based resin, a polyimide-based resin, a polyamide-based resin, or a siloxane-based resin. In an exemplary embodiment of the present invention, an opening which exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to the emitting area, and the non-emitting area may correspond to a portion adjacent to the opening of the pixel defining layer PDL.

The light emitting layer 182 may be disposed on the first electrode 181 exposed through the opening of the pixel defining layer PDL. In addition, the light emitting layer 182 may extend on a sidewall of the opening of the pixel defining layer PDL. In an exemplary embodiment of the present invention, the light emitting layer 182 may include an organic light emitting layer (EL), a hole injection layer (HIL), a hole transfer layer (HTL), an electron transfer layer (ETL), or an electron injection layer (EIL). In an exemplary embodiment of the present invention, except for the organic emission layer, the hole injection layer, the hole transport layer, the electron transport layer, and the electron injection layer may be formed in common to correspond to a plurality of pixels. In an exemplary embodiment of the present invention, a plurality of organic light emitting layers may be formed using light emitting materials for generating different colors of light such as a red color of light, a green color of light or a blue color of light in accordance with color pixels of the display device. In an exemplary embodiment of the present invention, the organic light emitting layer of the of the light emitting layer 182 may include a plurality of stacked light emitting materials for generating a red color of light, a green color of light and a blue color of light to thus emit a white color of light. Here, elements of the light emitting layer 182 are commonly formed so as to correspond to a plurality of pixels, and each pixel can be divided by a color filter layer.

The second electrode 183 may be disposed on the pixel defining layer PDL and the light emitting layer 182. The second electrode 183 may include a transmissive material or a reflective material in accordance with the emission type of the display device. For example, the second electrode 183 may be formed using aluminum, an alloy including aluminum, aluminum nitride, silver, an alloy including silver, tungsten, tungsten nitride, copper, an alloy including copper, nickel, an alloy including g nickel, chrome, chrome nitride, molybdenum, an alloy including molybdenum, titanium, titanium nitride, platinum, tantalum, tantalum nitride, neodymium, scandium, strontium ruthenium oxide, zinc oxide, indium tin oxide, tin oxide, indium oxide, gallium oxide, or indium zinc oxide. These may be used alone or in a combination thereof. In an exemplary embodiment of the present invention, the second electrode 183 may also have a single layer structure or a multi layer structure, which may include a metal film, an alloy film, a metal nitride film, a conductive metal oxide film and/or a transparent conductive film.

The thin film encapsulation layer TFE may be disposed on the second electrode 183. The thin film encapsulation layer TFE may prevent penetration of moisture and oxygen from outside. The thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer therebetween, but exemplary embodiments of the present invention are not limited thereto. In an exemplary embodiment of the present invention, it is possible to provide a sealing substrate for shielding outside air and moisture from penetrating into the display apparatus instead of the thin film encapsulation layer TFE.

According to an exemplary embodiment of the present invention, the display apparatus may include a substrate including first to third pixel areas, and first to third peripheral areas to form a notch. A notch peripheral area may be formed adjacent to the first to third pixel areas in the notch. A plurality of pixels may be disposed on the substrate, and may be provided in each of the first to third pixel areas. A first scan line may be disposed on the substrate. The first scan line may include a first portion disposed in the second pixel area, a second portion disposed in the third pixel area, and a third portion which connects the first portion to the second portion and is disposed in the notch peripheral area. A second scan line may be disposed on the substrate in the first pixel area. A surface area of the first scan line may be from about 90% to about 110% of a surface area of the second scan line. Preferably, surface areas of the first scan line and the second scan line may be the same to each other.

As a result of the surfaces areas being substantially the same, influences to the scan lines and the thin film transistors in the first to third pixel areas may be similar each other, such as due to a charge introduced during patterning for forming the contact hole of the insulation layer. Accordingly, a deviation of the thin film transistors between the first to third pixel areas may be reduced. For example, display quality deviations such as luminance deviation between the first to third pixel areas do not occur, and the display quality can be increased.

In addition, the pixel structure in the second and third pixel area and the pixel structures in the first pixel area may have similar characteristics because the first scan line and the data line cross each other in the notch peripheral area.

Figure 7:
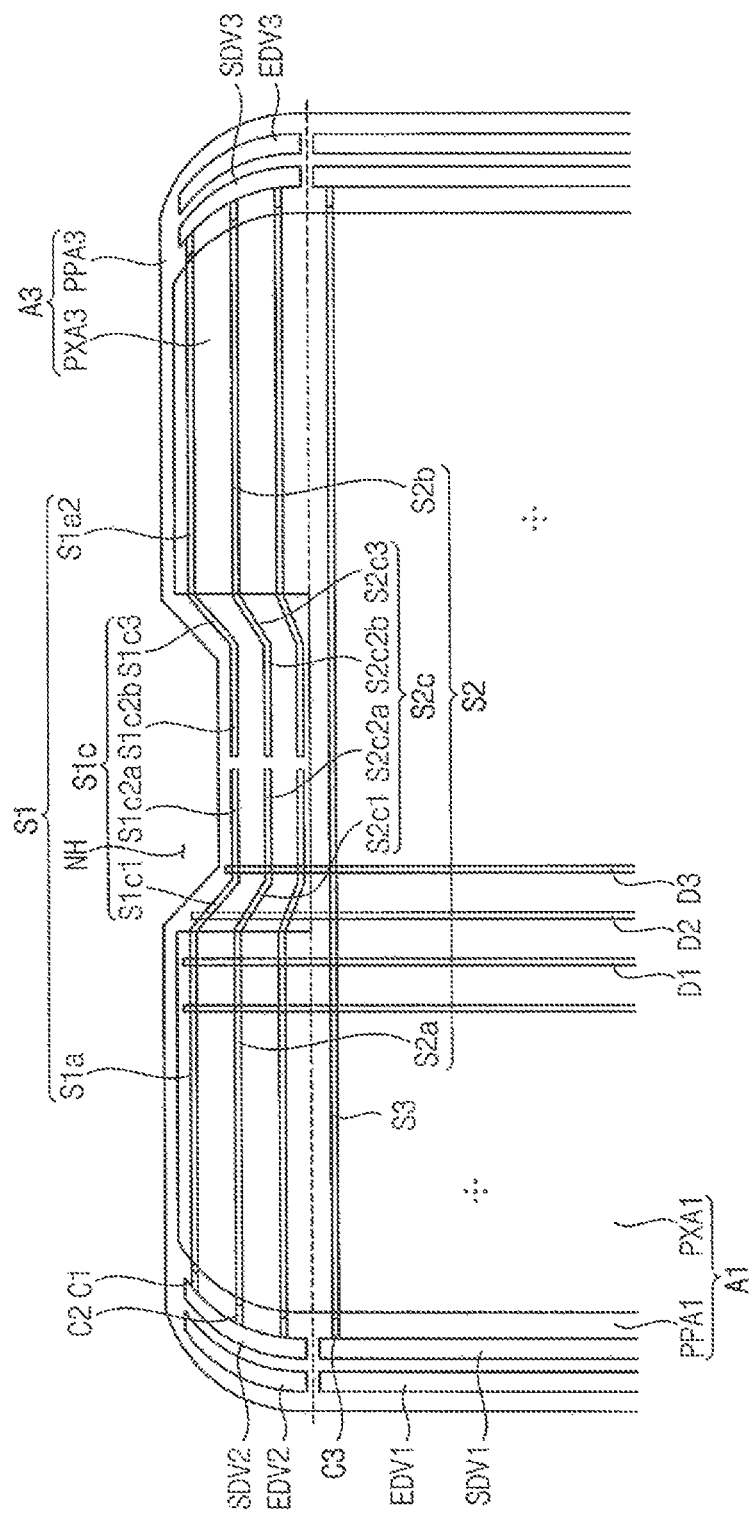
FIG. 7 is a partially enlarged view of a notch portion of a display apparatus according to an exemplary embodiment of the present invention.

FIG. 7 is a partially enlarged view of a notch portion of a display apparatus according to an exemplary embodiment of the present invention. The display apparatus may be substantially the same as the display apparatus described above with reference to FIGS. 1 to 6 except for a structure in which first and second scan lines are disconnected in a notch peripheral area. Therefore, duplicative descriptions may be omitted below.

Referring to FIGS. 1 to 7, the display apparatus may include the first area A1 including the first peripheral area PPA1 and the first pixel area PXA1, the second area A2 including the second peripheral area PPA2 and the second pixel area PXA2, the third area A3 including the third peripheral area PPA3 and the third pixel area PXA3 and the notch peripheral area NPA formed in the notch NH. The display apparatus may include the first scan line S1, the second scan line S2, the third scan line S3, the first connecting line C1, the second connecting line C2, the third connecting line C3, the first data line D1, the second data line D2, the third data line D3, the first scan driver SDV1, the second scan driver SDV2, the third scan driver SDV3, the first light emission driver EDV1, the second light emission driver EDV2, and the third light emission driver EDV3.

The first scan line S1 may include the first portion S1a, the second portion S1b, and the third portion S1c. The first portion S1a may be disposed in the first pixel area PXA1 and the second portion S1b may be disposed in the second pixel area PXA2. The third portion S1c may be disposed between the first portion S1a and the second portion S1b and disposed in the notch peripheral area NPA.

The third portion S1c may include the left inclined portion S1c1, central portions S1c2a and S1c2b, and a right inclined portion S1c3. The central portions S1c2a and S1c2b may be respectively referred to herein as a first central portion and a second central potion. As an example, since the notch NH may have a U-shape, the third portion S1c may include the left inclined portion S1c1 which is inclined in a right downward direction from the first portion S1a, the right inclined portion S1c3 which is inclined in a left downward direction from the second portion S1b, and the central portions S1c2a and S1c2b which are disposed between the left inclined portion S1c1 and the right inclined portion S1c3.

The second scan line S2 may extend in the first direction DR1. The second scan line S2 may include the first portion S2a, the second portion S2b and the third portion S2c. The first portion S2a may be disposed in the second pixel area PXA2. The second portion S2b may be disposed in the third pixel area PXA3. The third portion S2c may be disposed between the first portion S2a and the second portion S2b.

The third portion S2c may include the left inclined portion S2c1, central portions S2c2a and S2c2b (which may be referred to as first and second central portions, respectively) and the right inclined portion S2c3. As an example, since the notch NH may have a U-shape, the third portion S2c may include the left inclined portion S2c1 which is inclined in a right downward direction from the first portion S2a, the right inclined portion S2c3 which is inclined in a left downward direction from the second portion S2b, and the central portions S2c2a and S2c2b which are disposed between the left inclined portion S2c1 and the right inclined portion S2c3. Here, degree of tilting of the left inclined portion S2c1 and the right inclined portion S2c3 of the second scan line S2 may be different from degree of tilting of the left side inclined portion S1c1 and the right side inclined portion S1c3 of the first scan line S1.

The first scan line S1 and the second scan line S2 may be disconnected from each other between the central portions (e.g., between S1c2a and S1c2b and between S2c2a and S2c2b), respectively, and may receive signals from the second scan driver SDV2 and the third scan driver SDV3, respectively.

Figure 8:
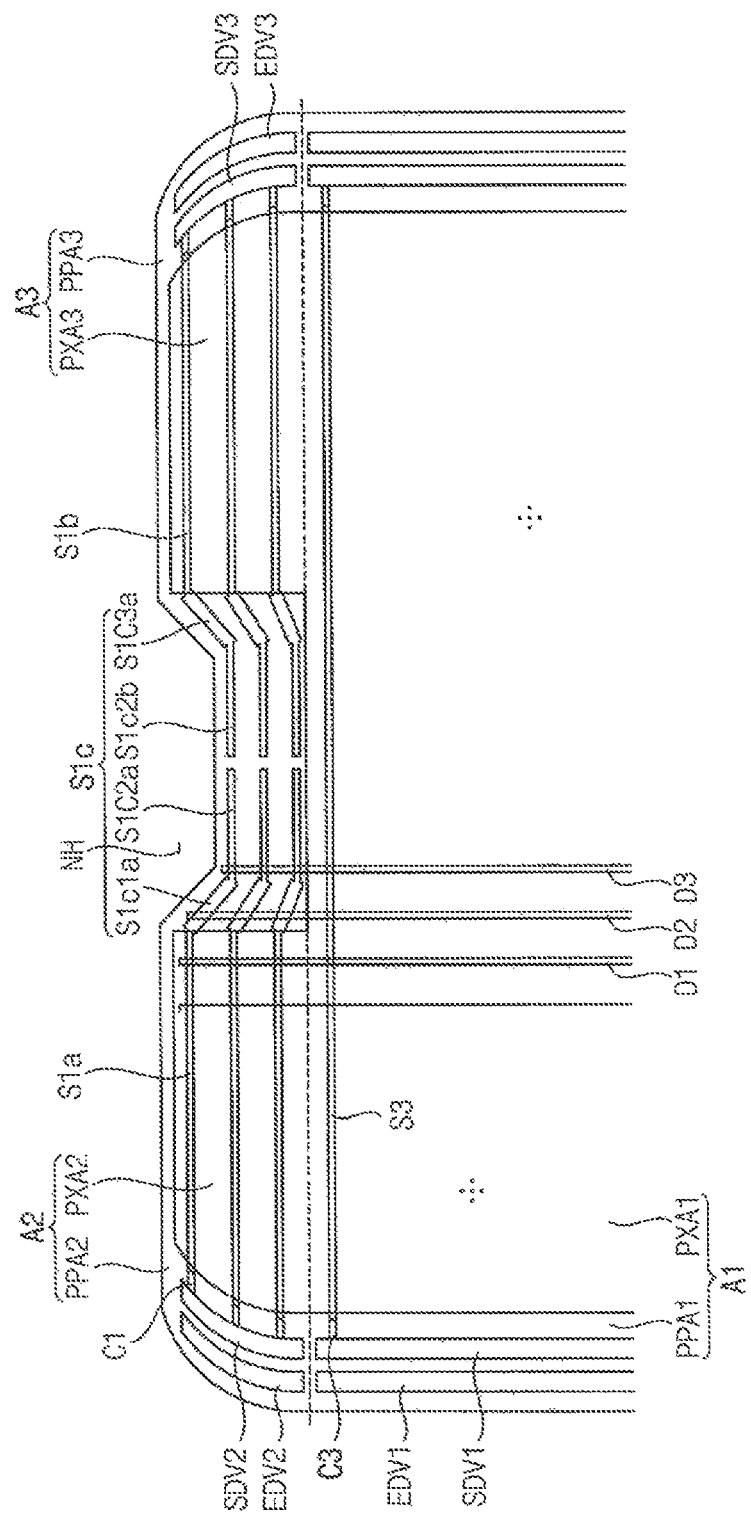
FIG. 8 is a partially enlarged view of a notch portion of a display apparatus according to an exemplary embodiment of the present invention.
Figure 9A:
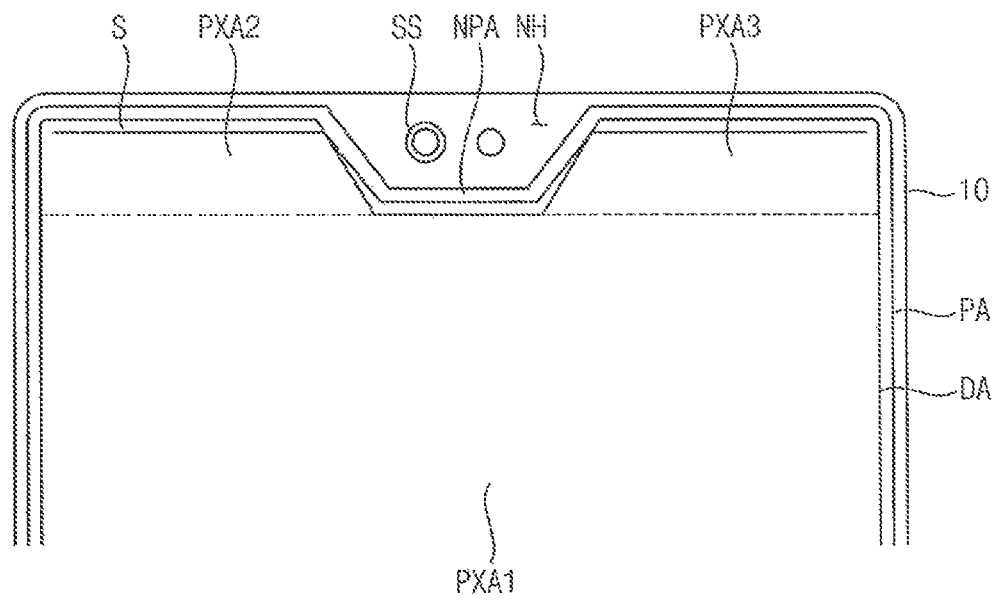
FIGS. 9A, 9B, 9C, 9D and 9E are each plan views of an exemplary shape of the notch portion of the display apparatus of FIG. 1.
Figure 9B:
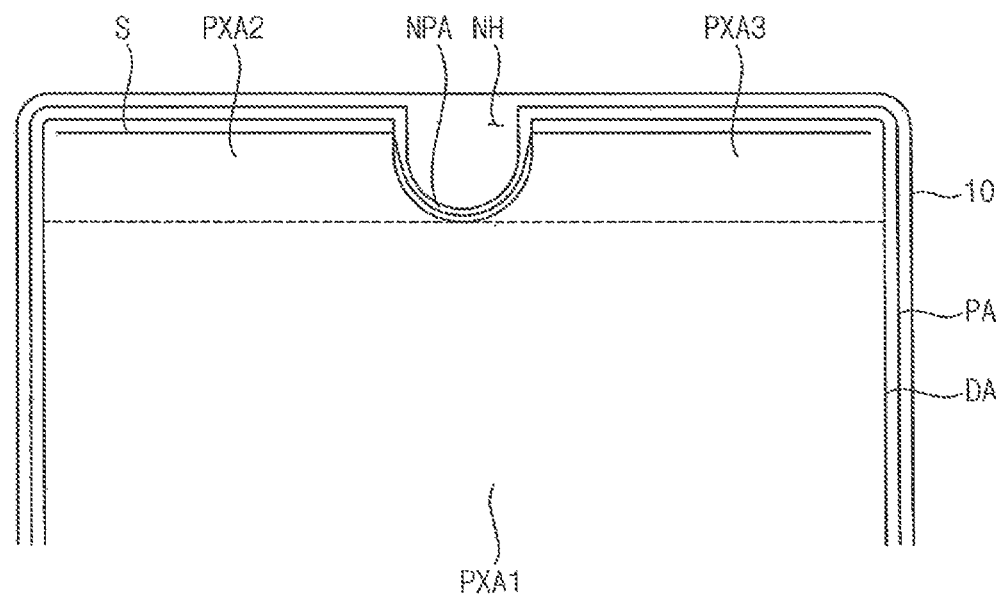
Figure 9C:
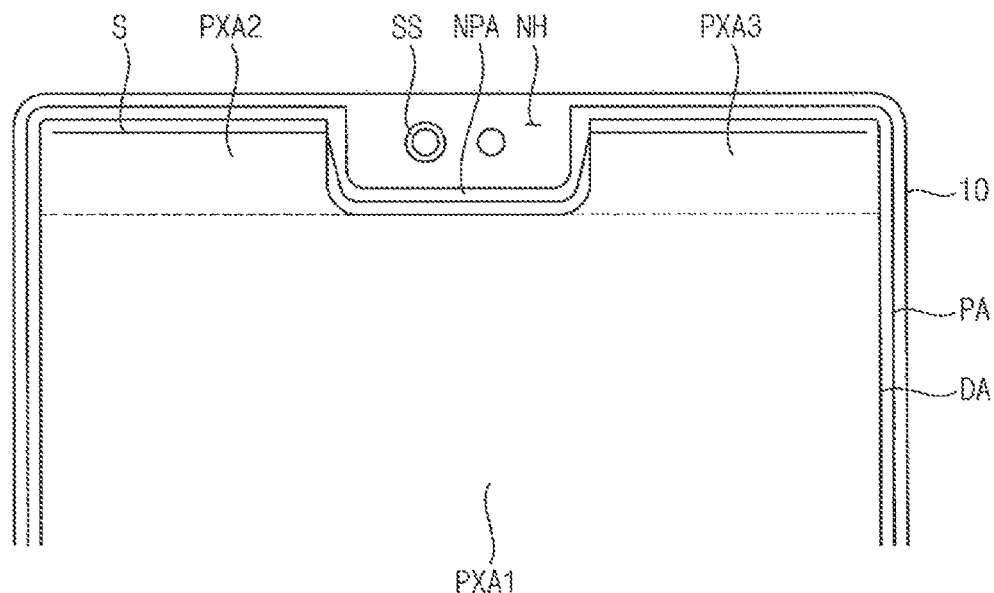
Figure 9D:
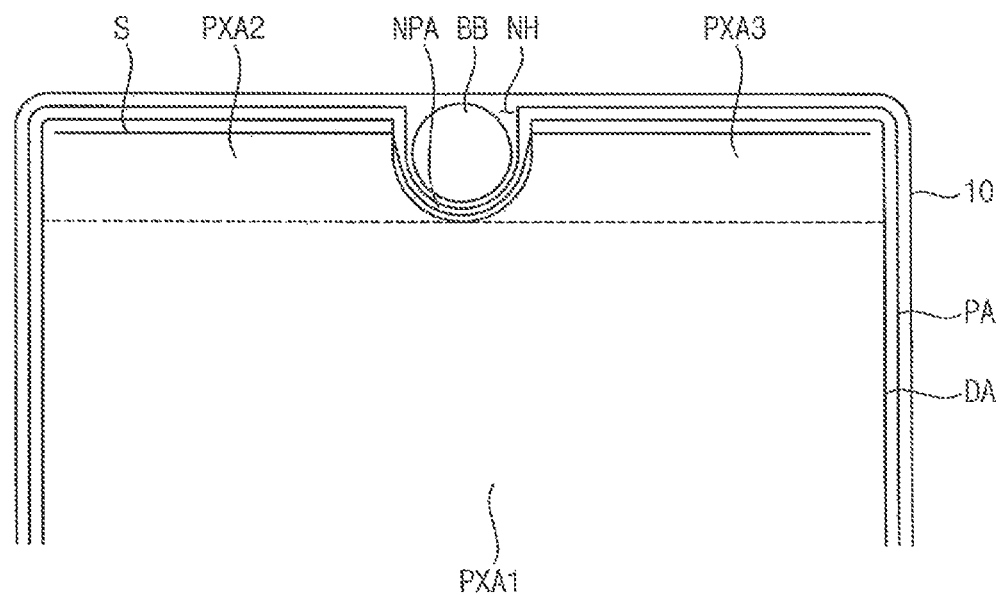
Figure 9E:
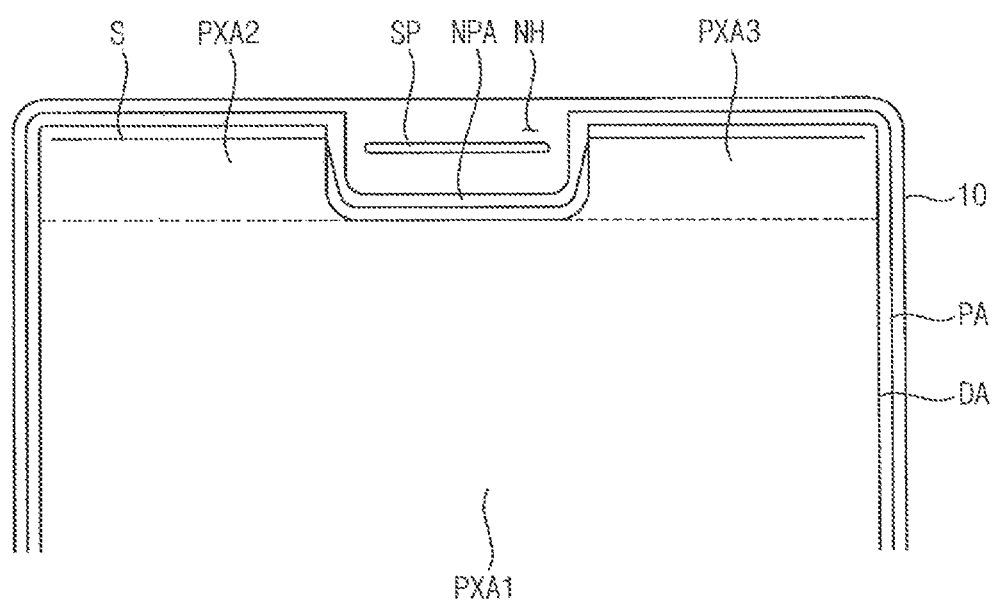

FIG. 8 is a partially enlarged view of a notch portion of a display apparatus according to an exemplary embodiment of the present invention. The display apparatus described below with reference to FIG. 8 may be substantially the same as the display apparatus described above with reference to FIGS. 1 to 7 except that the structure in which the first and second scan lines are disconnected in the notch peripheral area and the thickness thereof may be different than as described with reference to FIGS. 1 to 7. Thus, duplicative descriptions may be omitted below.

Referring to FIGS. 1 to 7 and 8, the display apparatus may include the first area A1 including the first peripheral area PPA1 and the first pixel area PXA1, the second area A2 including the second peripheral area PPA2 and the second pixel area PXA2, the third area A3 including the third peripheral area PPA3 and the third pixel area PXA3 and the notch peripheral area NPA formed in the notch NH. The display apparatus may include the first scan line S1, the second scan line S2, the third scan line S3, the first connecting line C1, the second connecting line C2, the third connecting line C3, the first data line D1, the second data line D2, the third data line D3, the first can driver SDV1, the second scan driver SDV2, the third scan driver SDV3, the first light emission driver EDV1, the second light emission driver EDV2, and the third light emission driver EDV3.

The first scan line S1 according to an exemplary embodiment of the present invention is described in more detail below with reference to FIG. 8; however, the descriptions of S1 may similarly be applied to the second scan line S2. Thus, the second scan line S2 may have substantially the same configuration as the first scan line S1 described with reference to FIG. 8.

The first scan line S1 may include the first portion S1$a$, the second portion S1$b$ and the third portion S1$c$. The first portion S1$a$ may be disposed in the second pixel area PXA2 and the second portion S1$b$ may be disposed in the third pixel are PXA3. The third portion S1$c$ may be disposed between the first portion S1$a$ and the second portion S1$b$ and may be disposed in the notch peripheral area NPA.

The third portion S1$c$ may include a left inclined portion S1$c$1$a$, the central portions S1$c$2$a$ and S1$c$2$b$ (e.g., the central portion may include a first central portion S1$c$2$a$ and a second central portion S1$c$2$b$), and a right inclined portion S1$c$3$a$. The first central portion S1$c$2$a$ may be connected with the left inclined portion S1$c$1$a$, and the second central portion S1$c$2$b$ may be connected with the right included portion S1$c$3$a$. Thus, the first central portion S1$c$2$a$ may be spaced apart from the second central portion S1$c$2$b$ (e.g., with a space therebetween). As an example, since the notch NH may have a U-shape, the third portion S1$c$ may include the left inclined portion S1$c$1$a$ which is inclined in a right downward direction from the first portion S1$a$, the right inclined portion S1$c$3$a$ which is inclined in a left downward direction from the second portion S1$b$, and the central portions S1$c$2$a$ and S1$c$2$b$ which are disposed between the left inclined portion S1$c$1$a$ and the right inclined portion S1$c$3$a$.

The central portions S1$c$2$a$ and S1$c$2$b$ may be disconnected from each other in the first scan line S1 and thus the first portion S1$a$ and the second portion S1$b$ of the first scan line S1 may receive separate signals from the second scan driver SDV2 and the third scan driver SDV3, respectively.

Since the first scan line S1 may have the same surface area as that of the third scan line S3, the third portion S1$c$ of the first scan line S1 may have a portion which has a different thickness from the other portions. For example, the left inclined portion S1$c$1$a$ and the right inclined portion S1$c$3$a$ may each have a thicker shape than the other portions of the first scan line S1 according to an exemplary embodiment of the present invention. Although the left inclined portion S1$c$1$a$ and the right inclined portion S1$c$3$a$ may have a thicker shape than the other portions of the first scan line S1 according to an exemplary embodiment of the present invention, exemplary embodiments of the present invention are not limited thereto. As an example, the center portions S1$c$2$a$ and S1$c$2$b$ may be thicker than the other portions of the first scan line S1 so that the first scan line S1 may have the same surface area as that of the third scan line S3. The description provided above with respect to the first scan line S1 having relatively thicker portions may also be applied to the second scan line S2, and thus the second scan line S2 may also have the same surface area as that of the third scan line S3.

Referring to FIGS. 5 and 8 again, an exemplary embodiment of the present invention will be described in more detail below.

According to an exemplary embodiment of the present invention, display apparatus may include the first area A1, the second area A2 connected with the first area A1 and the third area A3 connected with the first area A1. The notch NH and the notch peripheral area NPA may be positioned between the second area A2 and the third area A3. The display apparatus may include a first scan line (e.g., scan line S1). The first scan line may include a first portion (e.g., S1$a$) positioned in the second area A2. The first scan line may include a first inclined portion (e.g., S1$c$1$a$) positioned in the notch peripheral area NPA. The first scan line may include a first central portion (e.g., S1$c$2$a$) positioned in the notch peripheral area NPA and extending along a direction substantially parallel with an extending direction of the first portion of the first scan line (e.g., extending along the first direction DR1). The first scan line may include a second portion (e.g., S1$b$) positioned in the third area A3. The first scan line may include a second inclined portion (e.g., S1$c$3$a$) positioned in the notch peripheral area NPA. The first scan line may include a second central portion (S1$c$2$b$) positioned in the notch peripheral area NPA and extending along the direction substantially parallel with the extending direction of the first portion of the first scan line. The first central portion may be spaced apart from the second central portion. A second scan line (e.g., scan line S3) may be positioned in the first area A1 and may extend along the direction substantially parallel with the extending direction of the first portion of the first scan line. A surface area of the first scan line in the second area A2, the notch peripheral area NPA and the third area A3 may be from about 90% to about 110% of a surface area of the second scan line in the first area A1.

In an exemplary embodiment of the present invention, the surface area of the first scan line (e.g., scan line S1) in the second area A2, the notch peripheral area NPA and the third area A3 may be the same or substantially the same as the surface area of the second scan line (e.g., scan line S3) in the first area A1.

In an exemplary embodiment of the present invention, thicknesses of the first and second inclined portions of the first scan line (e.g., scan line S1) may be greater than a thickness of the second scan line (see, e.g., scan line S3 in FIG. 8).

FIGS. 9A, 9B, 9C, 9D and 9E are each plan views of an exemplary shape of the notch portion of the display apparatus of FIG. 1.

Referring to FIGS. 9A to 9E, a shape of the notch NH of the display apparatus may vary. For example, depending on the shape of the notch NH, the shape of a notch peripheral area NPA may be variously formed, and a shape of the scan line may be variously formed.

FIGS. 9$a$ to 9$e$ illustrate examples of the scan line S being arranged in various notches NH shapes in the notch peripheral area NPA. Thus, scan lines S1, S2 or S3 may have the same shapes or arrangements as those described with reference to scan line S. The notch NH may have various shapes such as a U shape or a left/right oblique/curved shape or a curved shape, and accordingly, an arrangement (shape) of the scan line S in the notch peripheral area NPA may be variously designed.

Here, the display area DA may include the second pixel area PXA2, the third pixel area PXA3, and the first pixel area PXA1 in which the notch NH is disposed between the second pixel area PXA2 and the third pixel area PXA3. A camera sensor SS, a speaker SP and a button BB of a device 10 may be located in the notch NH. The device 10 may be a mobile phone as a final product.

Figure 10A:
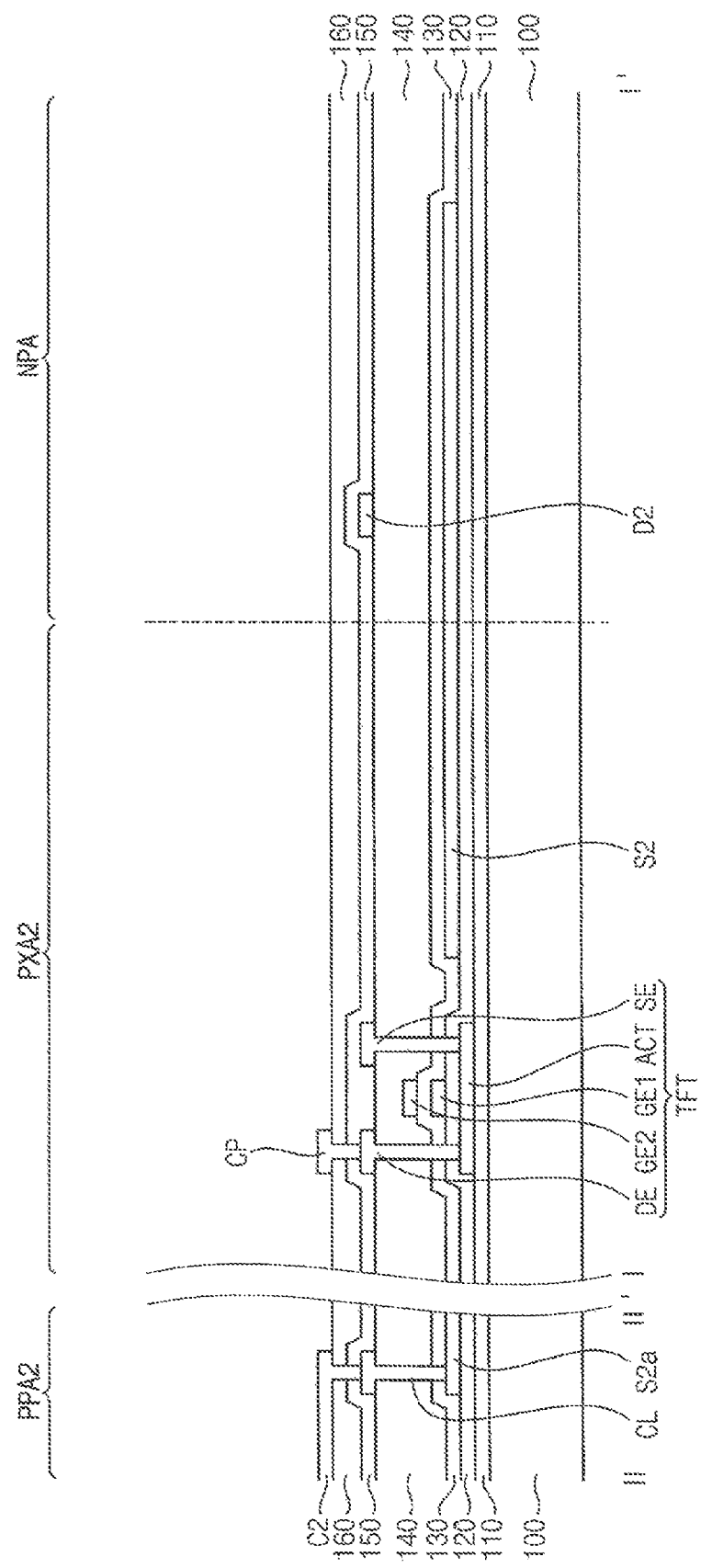
FIGS. 10A and 10B are cross-sectional views of an exemplary manufacturing method of the display apparatus of FIG. 1.
Figure 10B:
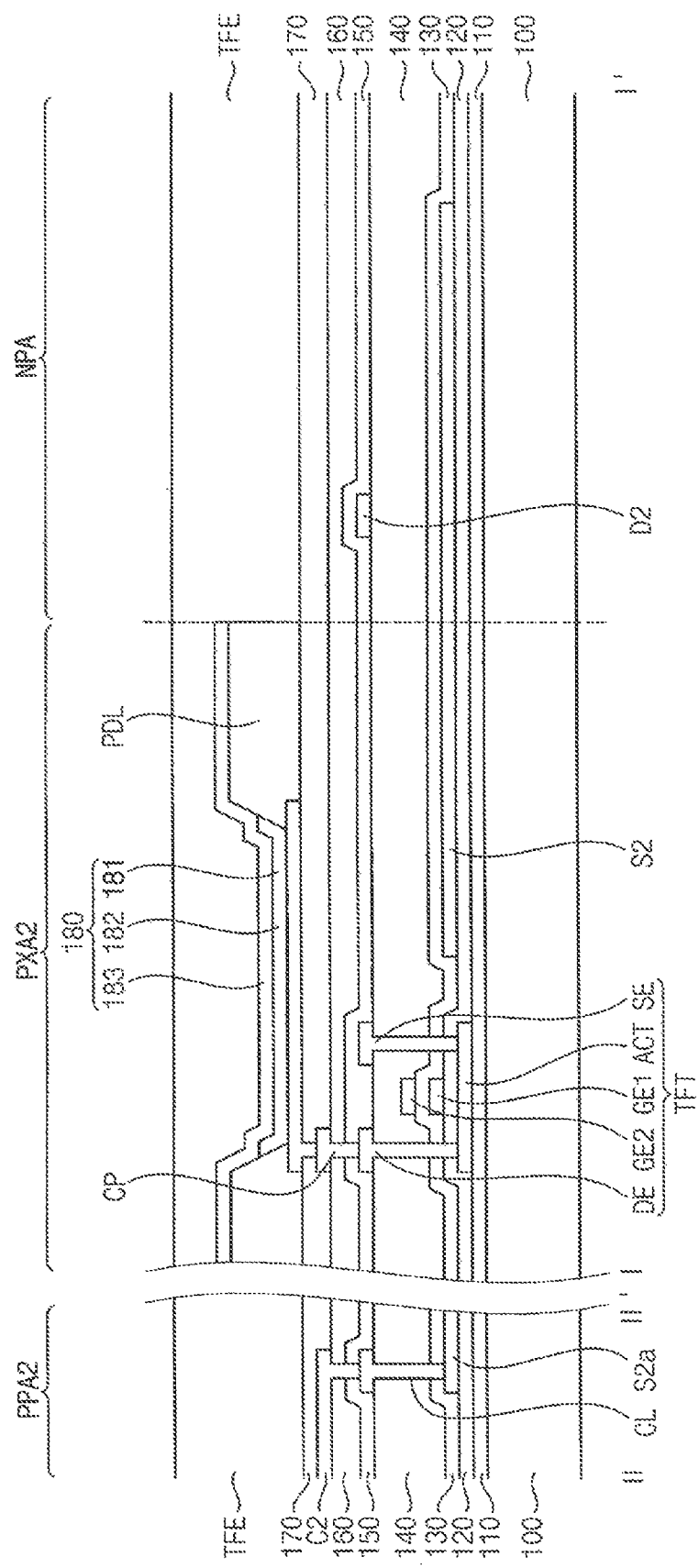

FIGS. 10A and 10B are cross-sectional views of an exemplary manufacturing method of the display apparatus of FIG. 1.

Referring to FIG. 10A, the buffer layer 110 may be formed on the substrate 100. The active pattern ACT may be formed on the buffer layer 110. The first insulation layer 120 may be formed on the buffer layer 110 on which the active pattern ACT is formed. The first gate pattern including the plurality of scan lines and the first gate electrode GE1 may be formed on the first insulation layer 120. The second insulation layer 130 may be formed on the first insulation layer 120 on which the first gate pattern is formed. The second gate pattern including the second gate electrode GE2 may be formed on the second insulation layer 130. The third insulation layer 140 may be formed on the second insulation layer 130 on which the second gate pattern is disposed.

In a peripheral area, a contact hole exposing the scan line may be formed through the third insulation layer 140 and the second insulation layer 130. In the pixel area, contact holes for exposing the active pattern ACT through the third insulation layer 140, the second insulation layer 130, and the first insulation layer 120 may be formed. The first data pattern including the drain electrode DE, the source electrode SE, the plurality of data lines, and the connection electrode CL may be formed on the third insulation layer 140 through which the contact holes are formed.

The fourth insulation layer 150 may be formed on the third insulation layer 140 on which the second data pattern is formed. The fourth insulation layer 150 may be formed using an inorganic material such as a silicon compound, a metal, or a metal oxide The fifth insulation layer 160 may be formed on the fourth insulation layer 150. The fifth insulation layer 160 may be formed using an organic material such as a photoresist, an acrylic resin, a polyimide resin, a polyamide resin, or a siloxane-based resin.

A portion of the fifth insulation layer 160 and the fourth insulation layer 150 may be removed to form a contact hole exposing the dram electrode DE and a contact hole exposing the connection electrode CL. For example, the contact holes may be formed using dry etching.

In the process using the dry etching, a charge may be introduced into a conductive structure of the display apparatus, and characteristics of the thin film transistor TFT can be changed. However, according to an exemplary embodiment of the present invention, influences of a charge on the scan lines and the thin film transistors in the first to third pixel area are similar, so that characteristic deviation of the thin film transistors might not occur between the first to third pixel areas. Thus, display quality deviations such as luminance deviation between the first to third pixel areas do not occur, and the display quality can be increased.

As an example, the charge may be introduced into the scan line through the contact hole and the connecting electrode CL in the peripheral area, and may affect the characteristics of the thin film transistor TFT through the scan line. However, since the plurality of scan lines do not have a contact hole structure that can affect the scan lines in the first to third pixel area, the characteristic deviation of the thin film transistors between the first to third pixel areas does not occur.

A second data pattern including the contact pad CP and the connecting line may be formed on the fifth insulation layer 160 on which the contact holes are formed.

Referring to FIG. 10B, the sixth insulation layer 170 may be formed on the fifth insulation layer 160 on which the second data pattern is disposed. The first electrode 181 may be formed on the sixth insulating layer 170. The pixel defining layer PDL may be formed on the sixth insulating layer 170 on which the first electrode 181 is disposed. The light emitting layer 182 may be formed on the first electrode 181 exposed by an opening of the pixel defining layer PDL. The second electrode 183 may be formed on the pixel defining layer PDL and the light emitting layer 182. the thin film encapsulation layer TFE may be formed on the second electrode 183.

According to an exemplary embodiment of the present invention, the display apparatus may include a substrate including first to third pixel areas, and first to third peripheral areas to form a notch. A notch peripheral area may be formed adjacent to the first to third pixel areas in the notch. A plurality of pixels may be disposed on the substrate, and provided in each of the first to third pixel areas. A first scan line may be disposed on the substrate, and may include a first portion disposed in the second pixel area, a second portion disposed in the third pixel area, and a third portion which connects the first portion to the second portion and is disposed in the notch peripheral area. A second scan line may be disposed on the substrate the first pixel area. Here, a surface area of the first scan line may be from about 90% to about 110% of a surface area of the second scan line. Preferably, surface areas of the first scan line and the second scan line may be the same to each other.

As a result, influences to the scan lines and the thin film transistors in the first to third pixel areas may be similar each other due to a charge introduced during patterning for forming the contact hole of the insulation layer. Accordingly, a deviation of the thin film transistors between the first to third pixel areas may be reduced. Thus, display quality deviations such as luminance deviation between the first to third pixel areas do not occur, and the display quality can be increased.

Figure 11:
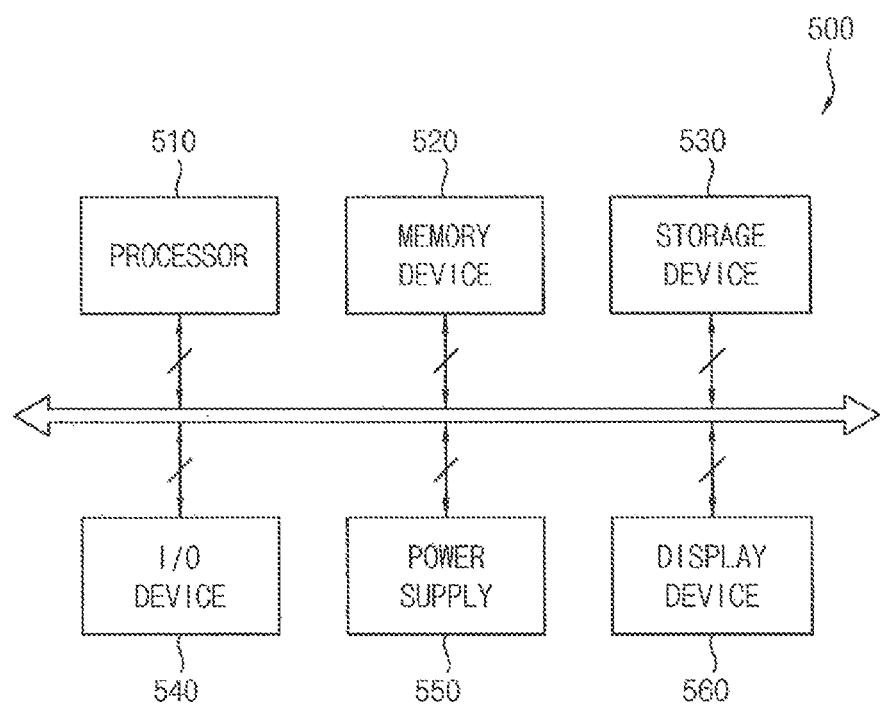
FIG. 11 is a block diagram of an electronic device according to an exemplary embodiment of the present invention.
Figure 12A:
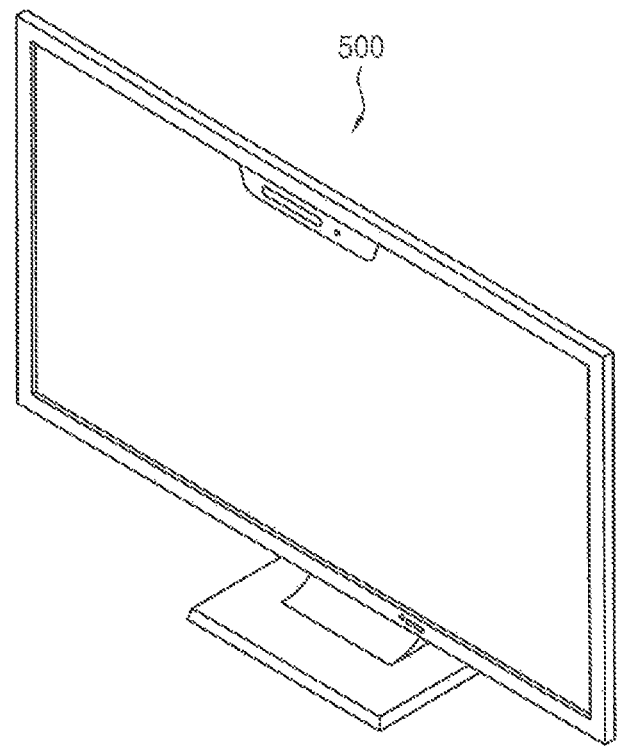
FIG. 12A is an exemplary diagram in which the electronic device of FIG. 11 is included in a television.
Figure 12B:
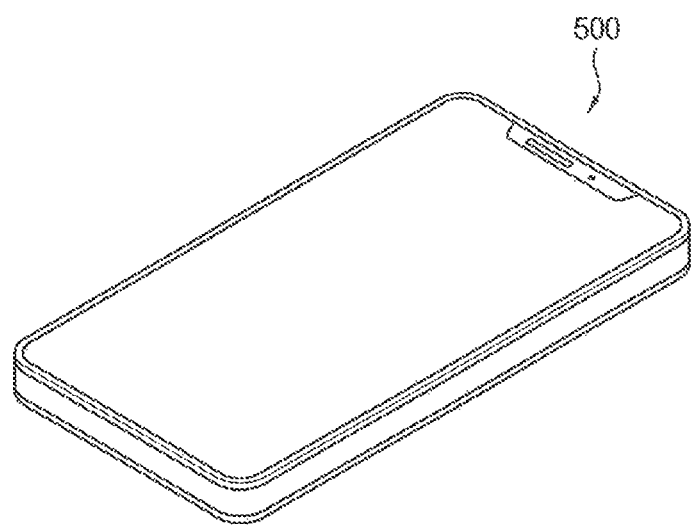
FIG. 12B is an exemplary diagram in which the electronic device of FIG. 11 is included in a smart phone.

FIG. 11 is a block diagram of an electronic device according to an exemplary embodiment of the present invention. FIG. 12A is an exemplary diagram in which the electronic device of FIG. 11 is included in a television. FIG. 12B is an exemplary diagram in which the electronic device of FIG. 11 is included in a smart phone.

Referring to FIGS. 11, 12A and 12B, an electronic device 500 according to an exemplary embodiment of the present invention may include a processor 510, a memory device 520, a storage device 530, an input/output (I/O) device 540, a power supply 550, and a display device 560. The display device 560 may include the display apparatus described in more detail above with reference to FIG. 1. The electronic device 500 may further include a plurality of ports for communicating with a video card, a sound card, a memory card, a universal serial bus (USB) device, other electronic devices, etc. In an exemplary embodiment of the present invention, referring to FIG. 12A, the electronic device 500 may be included in a television. In an exemplary embodiment of the present invention, referring to 12B, the electronic device 500 may be included in a smart phone. However, exemplary embodiments of the electronic device 500 are not limited thereto. For example, the electronic device 500 may be included in a cellular phone, a video phone, a smart pad, a smart watch, a tablet PC, a car navigation system, a computer monitor, a laptop, or a head mounted display (HMD).

The processor 510 may perform various computing functions. The processor 510 may be a micro processor, a central processing unit (CPU), or an application processor (AP). The processor 510 may be coupled to other components via an address bus, a control bus, or a data bus. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, or a mobile DRAM device. The storage device 530 may include a solid state drive (SSD) device, a hard disk drive (HDD) device, or a CD-ROM device. The I/O device 540 may include an input device such as a keyboard, a keypad, a mouse device, a touchpad, a touch-screen, etc and an output device such as a printer, or a speaker. The power supply 550 may provide power for operations of the electronic device 500.

The display device 560 may be coupled to other components via the buses or other communication links. In an exemplary embodiment of the present invention, the display device 560 may be included in the I/O device 540. As described above, the display device 560 may have a notch-formed display area including areas having different surface areas, and may have a uniform brightness irrespective of the area. However, since this has been described above, duplicative descriptions may be omitted.

Exemplary embodiments of the present invention may be applied to a display device and an electronic device including the display device. For example, exemplary embodiments of the present invention may be applied to a cellular phone, a smart phone, a video phone, a smart pad, a smart watch, a tablet PC, a car navigation system, a television, a computer monitor, a laptop, or a head mounted display.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display apparatus, comprising:
 a substrate comprising:
  a first pixel area including first pixels;
  a second pixel area including second pixels and having a surface area smaller than that of the first pixel area, the second pixel area being connected to the first pixel area;
  a third pixel area including third pixels and having a surface area smaller than that of the first pixel area, the third pixel area being spaced apart from the second pixel area and connected to the first pixel area;
  a first middle area adjacent to the first, second and third pixel areas; and
  a second middle area adjacent to the second and third pixel areas and the first middle area, the second middle area being spaced apart from the first pixel area by the first middle area, an optical device being disposed under the second middle area;
 a first scan line disposed on the substrate in the first pixel area and electrically connected to the first pixels;
 a first connecting line disposed on the substrate in a first peripheral area and configured to electrically connect the first scan line to a first circuit-portion of a scan driver;
 a second scan line disposed on the substrate, electrically connected to the second pixels, and comprising a first portion disposed in the second pixel area and a second portion disposed in the first middle area;
 a second connecting line disposed on the substrate in a second peripheral area and configured to electrically connect the second scan line to a second circuit-portion of the scan driver;
 a third scan line disposed on the substrate, electrically connected to the third pixels, and comprising a first portion disposed in the third pixel area and a second portion disposed in the first middle area; and
 a third connecting line disposed on the substrate in a third peripheral area and configured to electrically connect the third scan line to a third circuit-portion of the scan driver.

2. The display apparatus of claim 1, wherein the second portion of the second scan line includes a central portion which is parallel with the first portion of the second scan line and an inclined portion which is inclined with respect to the first portion of the second scan line in the first middle area.

3. The display apparatus of claim 2, wherein a surface area of the inclined portion of the second portion of the second scan line is larger than a surface area of the central portion of the second portion of the second scan line.

4. The display apparatus of claim 2, wherein a surface area of the inclined portion of the second portion of the second scan line is the same as a surface area of the central portion of the second portion of the second scan line.

5. The display apparatus of claim 1, wherein the second portion of the third scan line includes a central portion which is parallel with the first portion of the third scan line and an inclined portion which is inclined with respect to the first portion of the third scan line in the first middle area.

6. The display apparatus of claim 5, wherein a surface area of the inclined portion of the second portion of the third scan line is larger than a surface area of the central portion of the second portion of the third scan line.

7. The display apparatus of claim 5, wherein a surface area of the inclined portion of the second portion of the third scan line is the same as a surface area of the central portion of the second portion of the third scan line.

8. The display apparatus of claim 1, wherein the second scan line is electrically connected to the third scan line in the first middle area.

9. The display apparatus of claim 1, wherein the second scan line is electrically disconnected to the third scan line in the first middle area.

10. The display apparatus of claim 1, wherein each of a surface area of the second scan line and a surface area of the third scan line is from about 90% to about 110% of a surface area of the first scan line.

11. A display apparatus, comprising:
 a substrate comprising:

a first pixel area including first pixels;
a second pixel area including second pixels and having a surface area smaller than that of the first pixel area, the second pixel area being connected to the first pixel area;
a third pixel area including third pixels and having a surface area smaller than that of the first pixel area, the third pixel area being spaced apart from the second pixel area and connected to the first pixel area;
a notch area formed between the second pixel area and the third pixel area, an optical device being disposed at the notch area; and
a notch peripheral area adjacent to the first, second and third pixel areas, the notch area being spaced apart from the first pixel area by the notch peripheral area;
a first scan line disposed on the substrate in the first pixel area and electrically connected to the first pixels;
a first connecting line disposed on the substrate in a first peripheral area and configured to electrically connect the first scan line to a first circuit-portion of a scan driver;
a second scan line disposed on the substrate, electrically connected to the second pixels, and comprising a first portion disposed in the second pixel area and a second portion disposed in the notch peripheral area;
a second connecting line disposed on the substrate in a second peripheral area and configured to electrically connect the second scan line to a second circuit-portion of the scan driver;
a third scan line disposed on the substrate, electrically connected to the third pixels, and comprising a first portion disposed in the third pixel area and a second portion disposed in the notch peripheral area; and
a third connecting line disposed on the substrate in a third peripheral area and configured to electrically connect the third scan line to a third circuit-portion of the scan driver.

12. The display apparatus of claim 11, wherein the second portion of the second scan line includes a central portion which is parallel with the first portion of the second scan line and an inclined portion which is inclined with respect to the first portion of the second scan line in the notch peripheral area.

13. The display apparatus of claim 12, wherein a surface area of the inclined portion of the second portion of the second scan line is larger than a surface area of the central portion of the second portion of the second scan line.

14. The display apparatus of claim 12, wherein a surface area of the inclined portion of the second portion of the second scan line is the same as a surface area of the central portion of the second portion of the second scan line.

15. The display apparatus of claim 11, wherein the second portion of the third scan line includes a central portion which is parallel with the first portion of the third scan line and an inclined portion which is inclined with respect to the first portion of the third scan line in the notch peripheral area.

16. The display apparatus of claim 15, wherein a surface area of the inclined portion of the second portion of the third scan line is larger than a surface area of the central portion of the second portion of the third scan line.

17. The display apparatus of claim 15, wherein a surface area of the inclined portion of the second portion of the third scan line is the same as a surface area of the central portion of the second portion of the third scan line.

18. The display apparatus of claim 11, wherein the second scan line is electrically connected to the third scan line in the notch peripheral area.

19. The display apparatus of claim 11, wherein the second scan line is electrically disconnected to the third scan line in the notch peripheral area.

20. The display apparatus of claim 11, wherein each of a surface area of the second scan line and a surface area of the third scan line is from about 90% to about 110% of a surface area of the first scan line.

* * * * *